(12) United States Patent
Kuo et al.

(10) Patent No.: US 12,021,026 B2
(45) Date of Patent: Jun. 25, 2024

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Hung-Jui Kuo, Hsinchu (TW); Hui-Jung Tsai, Hsinchu (TW); Jyun-Siang Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/306,227

(22) Filed: Apr. 24, 2023

(65) Prior Publication Data

US 2023/0260898 A1 Aug. 17, 2023

Related U.S. Application Data

(60) Continuation of application No. 17/671,524, filed on Feb. 14, 2022, now Pat. No. 11,670,582, which is a
(Continued)

(51) Int. Cl.
*H01L 23/522* (2006.01)
*H01L 21/56* (2006.01)
(Continued)

(52) U.S. Cl.
CPC ........ *H01L 23/5226* (2013.01); *H01L 21/565* (2013.01); *H01L 21/76897* (2013.01);
(Continued)

(58) Field of Classification Search
CPC ............ H01L 23/5226; H01L 23/3128; H01L 23/481; H01L 23/5283; H01L 23/53228; H01L 23/544; H01L 21/565; H01L 21/76897; H01L 24/08; H01L 24/16; H01L 24/48; H01L 24/73; H01L 25/0655; H01L 2223/54426; H01L 2224/02331; H01L 2224/02379; H01L 2224/02381
(Continued)

(56) References Cited

U.S. PATENT DOCUMENTS 9,000,584 B2 4/2015 Lin et al.
9,048,222 B2 6/2015 Hung et al.
(Continued)

*Primary Examiner* — Tu-Tu V Ho
(74) *Attorney, Agent, or Firm* — JCIPRNET

(57) ABSTRACT

A package structure includes at least one semiconductor die, an insulating encapsulant and a redistribution structure. The at least one semiconductor die has a plurality of conductive posts, wherein a top surface of the plurality of conductive posts has a first roughness. The insulating encapsulant is encapsulating the at least one semiconductor die. The redistribution structure is disposed on the insulating encapsulant in a build-up direction and is electrically connected to the at least one semiconductor die. The redistribution structure includes a plurality of conductive via portions and a plurality of conductive body portions embedded in dielectric layers, wherein a top surface of the plurality of conductive body portions has a second roughness, and the second roughness is greater than the first roughness.

20 Claims, 19 Drawing Sheets

Related U.S. Application Data division of application No. 16/928,009, filed on Jul. 14, 2020, now Pat. No. 11,251,121.

(60) Provisional application No. 62/904,707, filed on Sep. 24, 2019.

(51) Int. Cl.
| | |
|---|---|
| *H01L 21/768* | (2006.01) |
| *H01L 23/00* | (2006.01) |
| *H01L 23/31* | (2006.01) |
| *H01L 23/48* | (2006.01) |
| *H01L 23/528* | (2006.01) |
| *H01L 23/532* | (2006.01) |
| *H01L 23/544* | (2006.01) |
| *H01L 25/065* | (2023.01) |

(52) U.S. Cl.
CPC ........ *H01L 23/3128* (2013.01); *H01L 23/481* (2013.01); *H01L 23/5283* (2013.01); *H01L 23/53228* (2013.01); *H01L 23/544* (2013.01); *H01L 24/08* (2013.01); *H01L 24/16* (2013.01); *H01L 24/48* (2013.01); *H01L 24/73* (2013.01); *H01L 25/0655* (2013.01); *H01L 2223/54426* (2013.01); *H01L 2224/02331* (2013.01); *H01L 2224/02379* (2013.01); *H01L 2224/02381* (2013.01)

(58) Field of Classification Search
USPC .......................................................... 257/774
See application file for complete search history.

(56) References Cited

U.S. PATENT DOCUMENTS

| | | | |
|---|---|---|---|
| 9,048,233 | B2 | 6/2015 | Wu et al. |
| 9,064,874 | B2 | 6/2015 | Edelstein et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 11,462,462 | B2 * | 10/2022 | Yoo .................. H01L 24/05 |

\* cited by examiner

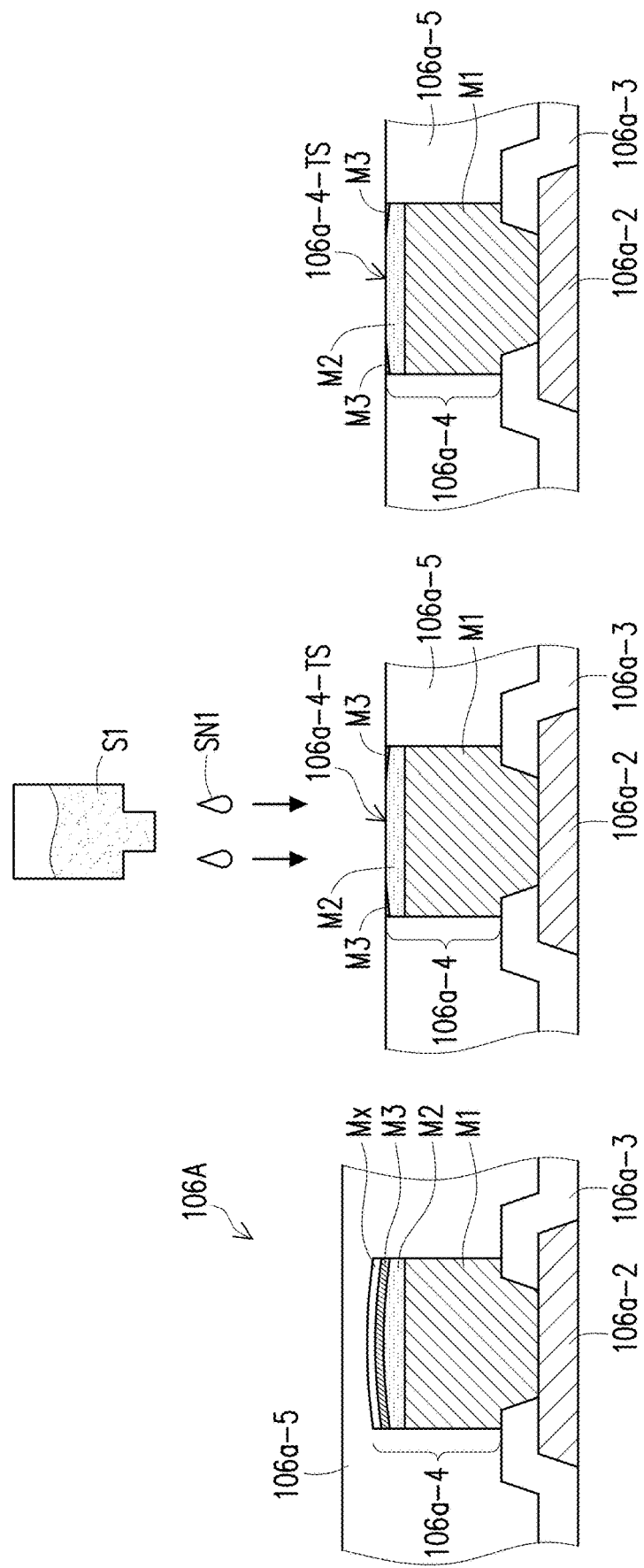

PACKAGE STRUCTURE AND METHOD OF FABRICATING THE SAME

CROSS-REFERENCE TO RELATED APPLICATION

This application is a continuation application of and claims the priority benefit of U.S. application Ser. No. 17/671,524, filed on Feb. 14, 2022, now allowed, which is a divisional application of and claims the priority benefit of U.S. application Ser. No. 16/928,009, filed on Jul. 14, 2020, now issued as U.S. Pat. No. 11,251,121, which claims the priority benefit of U.S. provisional application Ser. No. 62/904,707, filed on Sep. 24, 2019. The entirety of each of the above-mentioned patent applications is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging. In addition, such packages may further be integrated to a semiconductor substrate or carrier after dicing. Therefore, the reliability of the electrical connection between conductive terminals and an internal component (e.g. a redistribution circuit structure) within each package becomes important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 2A to FIG. 2C are enlarged sectional views of a semiconductor die at various stages in a method of fabricating a package structure according to some exemplary embodiments of the present disclosure.

DETAILED DESCRIPTION

Figure 1A:
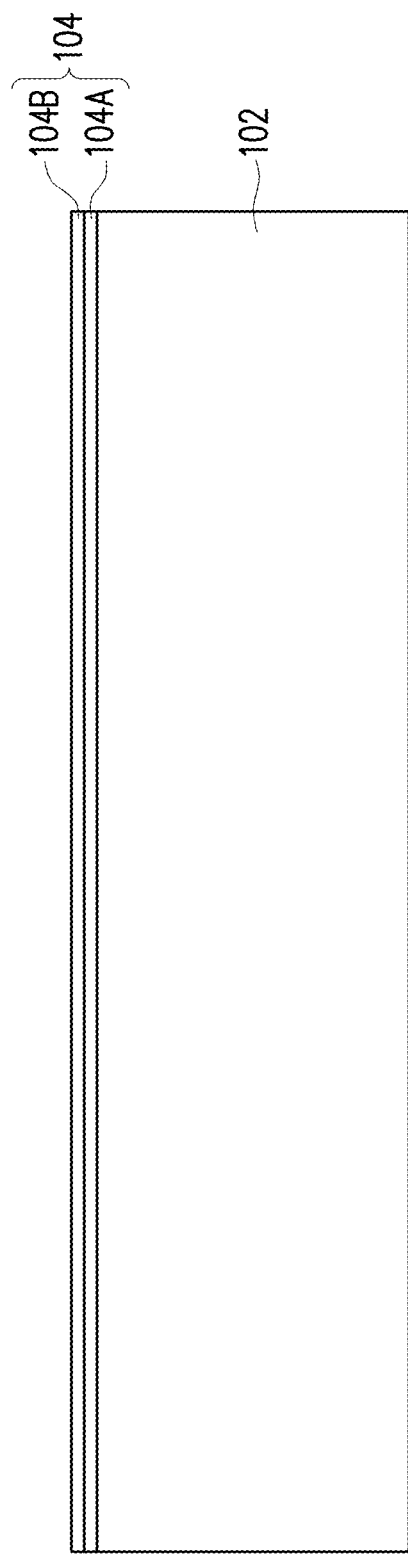
FIG. 1A to FIG. 1K are schematic sectional views of various stages in a method of fabricating a package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are schematic sectional views of various stages in a method of fabricating a package structure according to some exemplary embodiments of the present disclosure. Referring to FIG. 1A, a carrier 102 with a buffer layer 104 coated thereon is provided. In some embodiments, the carrier 102 may be a glass carrier or any suitable carrier for carrying a semiconductor wafer or a reconstituted wafer used for the method of fabricating the package structure.

In some embodiments, the buffer layer 104 includes a de-bonding layer 104A and a dielectric layer 104B, wherein the de-bonding layer 104A is located in between the carrier 102 and the dielectric layer 104B. In certain embodiments, the de-bonding layer 104A is disposed on the carrier 102, and the material of the de-bonding layer 104A may be any material suitable for bonding and de-bonding the carrier 102 from the above layer(s) (e.g., the dielectric layer 104B) or any wafer(s) disposed thereon. In some embodiments, the de-bonding layer 104A may include a release layer (such as a light-to-heat conversion ("LTHC") layer) or an adhesive layer (such as an ultra-violet curable adhesive or a heat curable adhesive layer). In some embodiments, the dielectric layer 104B may be formed above the de-bonding layer 104A. The dielectric layer 104B may be made of dielectric materials such as benzocyclobutene ("BCB"), polybenzoxazole ("PBO"), or any other suitable polymer-based dielectric material.

It is noted that the materials of the carrier 102, the de-bonding layer 104A and the dielectric layer 104B are not limited to the descriptions of the embodiments. In some alternative embodiments, the dielectric layer 104B may be optionally omitted; in other words, merely the de-bonding layer 104A is formed over the carrier 102. In certain embodiments, a die-attach film (not shown) may be directly formed on the de-bonding layer 104A for the attachment to above components.

Figure 1B:
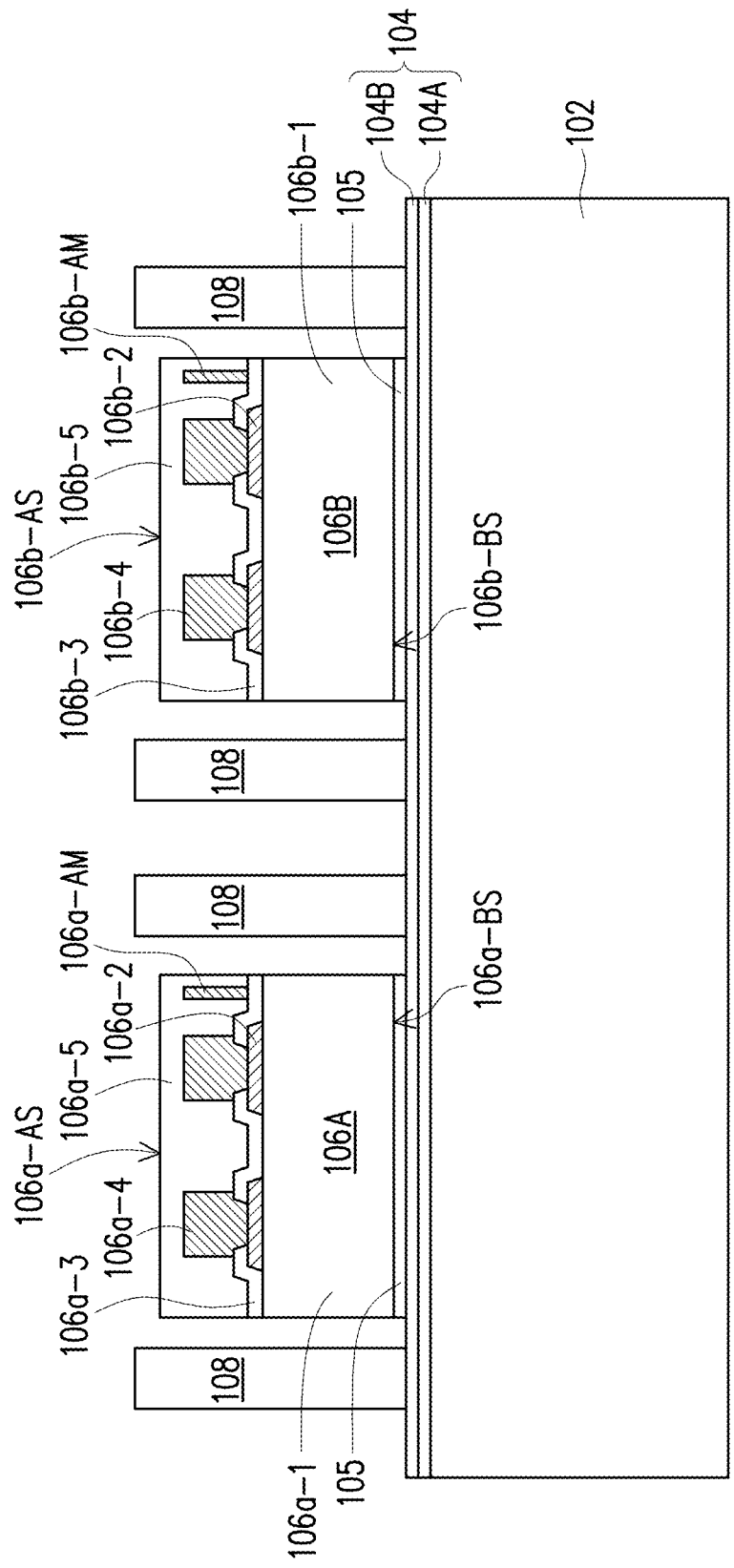

Referring to FIG. 1B, after providing the buffer layer 104, a plurality of through insulator vias 108 and a plurality of semiconductor dies (first semiconductor die 106A and second semiconductor die 106B) are provided on the buffer layer 104 over the carrier 102. In some embodiments, the through insulator vias 108 are through integrated fan-out ("InFO") vias. In one embodiment, the formation of the through insulator vias 108 includes forming a mask pattern (not shown) with openings, then forming a metallic material (not shown) filling up the openings by electroplating or deposition, and removing the mask pattern to form the through insulator vias 108 on the buffer layer 104. The material of the mask pattern may include a positive photo-resist or a negative photo-resist. In one embodiment, the material of the through insulator vias 108 may include a metal material such as copper or copper alloys, or the like. However, the disclosure is not limited thereto.

In an alternative embodiment, the through insulator vias 108 may be formed by forming a seed layer (not shown) on the buffer layer 104; forming the mask pattern with openings exposing portions of the seed layer; forming the metallic material on the exposed portions of the seed layer to form the through insulator vias 108 by plating; removing the mask pattern; and then removing portions of the seed layer exposed by the through insulator vias 108. For example, the seed layer may be a titanium/copper composited layer. For simplification, only four through insulator vias 108 are illustrated in FIG. 1B. However, it should be noted that the number of through insulator vias 108 is not limited thereto, and can be selected based on requirement.

As illustrated in FIG. 1B, a first semiconductor die 106A and a second semiconductor die 106B may be picked and placed on the buffer layer 104. In certain embodiments, the first semiconductor die 106A has an active surface 106a-AS and a backside surface 106a-BS opposite to the active surface 106a-AS. For example, the backside surface 106a-BS of the first semiconductor die 106A may be attached to the buffer layer 104 through a die attach film 105. Similarly, the second semiconductor die 106B has an active surface 106b-AS and a backside surface 106b-BS opposite to the active surface 106b-AS. For example, the backside surface 106b-BS of the second semiconductor die 106B may be attached to the buffer layer 104 through a die attach film 105. By using the die attach film 105, a better adhesion between the first semiconductor die 106A, the second semiconductor die 106B and the buffer layer 104 is ensured. In the exemplary embodiment, only two semiconductor dies (106A/106B) are illustrated. However, the disclosure is not limited thereto. It should be noted that the number of semiconductor dies (106A/106B) disposed on the buffer layer 104 may be adjusted based on product requirement.

In the exemplary embodiment, the first semiconductor die 106A and the second semiconductor die 106B respectively includes a semiconductor substrate (106a-1/106b-1), a plurality of conductive pads (106a-2/106b-2), a passivation layer (106a-3/106b-3), a plurality of conductive posts (106a-4/106b-4), a protection layer (106a-5/106b-5) and an alignment mark (106a-AM/106b-AM). As illustrated in FIG. 1B, the plurality of conductive pads (106a-2/106b-2) is disposed on the semiconductor substrate (106a-1/106b-1). The passivation layer (106a-3/106b-3) is formed over the semiconductor substrate (106a-1/106b-1) and has openings that partially expose the conductive pads (106a-2/106b-2) on the semiconductor substrate (106a-1/106b-1). The semiconductor substrate (106a-1/106b-1) may be a bulk silicon substrate or a silicon-on-insulator (SOI) substrate, and further includes active components (e.g., transistors or the like) and optionally passive components (e.g., resistors, capacitors, inductors or the like) formed therein. The conductive pads (106a-2/106b-2) may be aluminum pads, copper pads or other suitable metal pads. The passivation layer (106a-3/106b-3) may be a silicon oxide layer, a silicon nitride layer, a silicon oxy-nitride layer or a dielectric layer formed of any suitable dielectric materials. Furthermore, in some embodiments, a post-passivation layer (not shown) is optionally formed over the passivation layer (106a-3/106b-3). The post-passivation layer covers the passivation layer (106a-3/106b-3) and has a plurality of contact openings. The conductive pads (106a-2/106b-2) are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts (106a-4/106b-4) are formed on the conductive pads (106a-2/106b-2) by plating. In certain embodiments, the alignment mark (106a-AM/106b-AM) may be formed on the passivation layer (106a-3/106b-3) along with the formation of the conductive posts (106a-4/106b-4). For example, the alignment mark (106a-AM/106b-AM) and the conductive posts (106a-4/106b-4) are formed of the same materials. In some embodiments, the protection layer (106a-5/106b-5) is formed on the passivation layer (106a-3/106b-3) or on the post passivation layer, and covering the conductive posts (106a-4/106b-4) and the alignment mark (106a-AM/106b-AM) so as to protect these components.

In some embodiments, when a plurality of the semiconductor dies (106A/106B) are placed on the buffer layer 104, then the semiconductor dies (106A/106B) may be arranged in an array, and when the semiconductor dies (106A/106B are arranged in an array, the through insulator vias 108 may be classified into groups. The number of the semiconductor dies (106A/106B) may correspond to the number of the groups of the through insulator vias 108. In the illustrated embodiment, the semiconductor dies (106A/106B) may be picked and placed on the buffer layer 104 after the formation of the through insulator vias 108. However, the disclosure is not limited thereto. In some alternative embodiments, the semiconductor dies (106A/106B) may be picked and placed on the buffer layer 104 before the formation of the through insulator vias 108.

Furthermore, in some embodiments, the first semiconductor die 106A and the second semiconductor die 106B may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. For example, in one embodiment, the first semiconductor die 106A and the second semiconductor die 106B may be the same type of semiconductor die. In alternative embodiments, the first semiconductor die 106A and the second semiconductor die 106B may be different types of semiconductor die. The disclosure is not limited thereto.

Figure 1C:
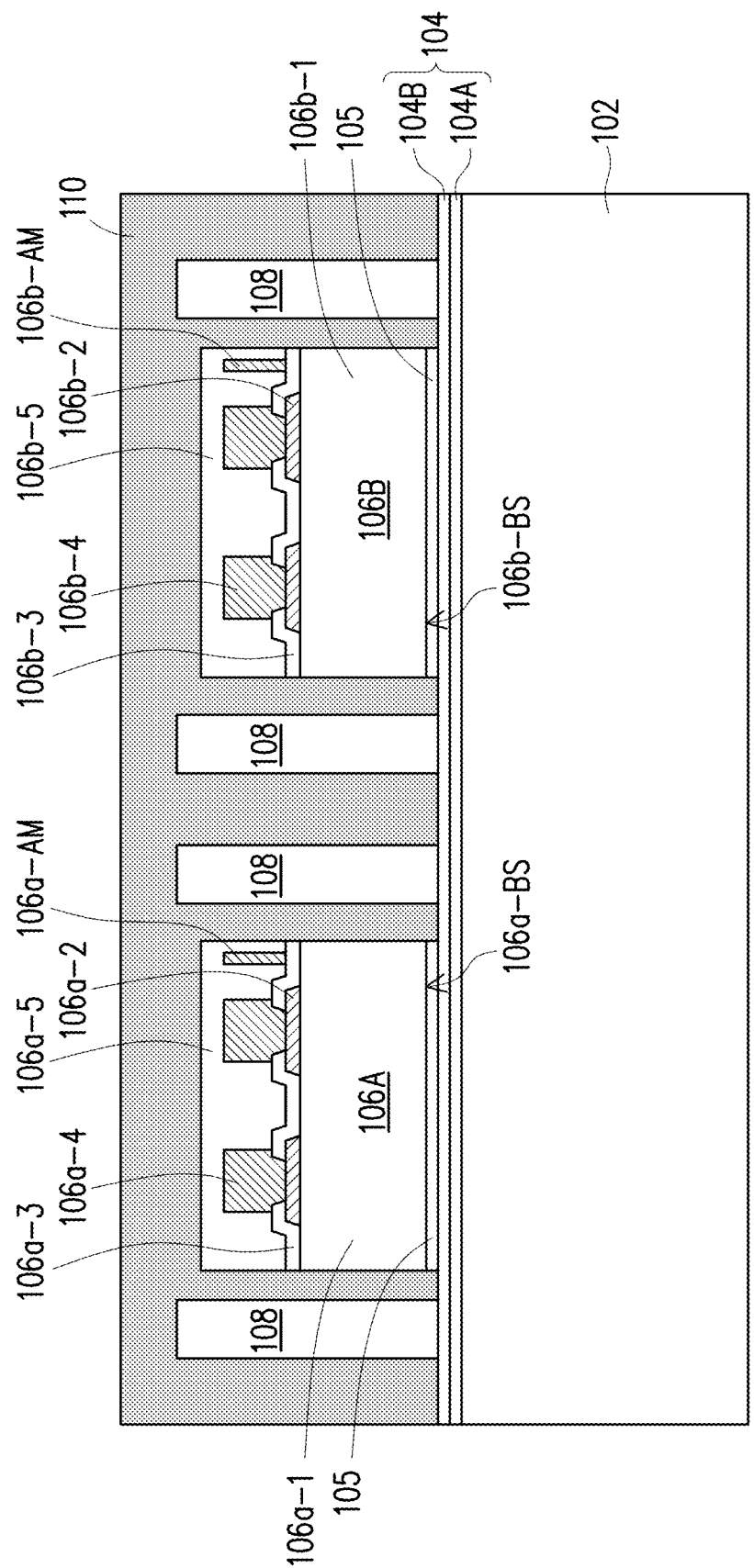

Referring to FIG. 1C, in a next step, an insulating material 110 is formed on the buffer layer 104 and over the semiconductor dies (106A/106B). In some embodiments, the insulating material 108 is formed to cover the through insulator vias 108. In some embodiments, the insulating material 110 is formed through, for example, a compression molding process, filling up the gaps between the semiconductor dies (106A/106B) and the through insulating vias 108 to encapsulate the semiconductor dies (106A/106B). The insulating material 110 also fills up the gaps between adjacent through insulator vias 108 to encapsulate the through insulator vias 108. At this stage, the conductive posts (106*a*-4/106*b*-4), the protection layer (106*a*-5/106*b*-5), the alignment mark (106*a*-AM/106*b*-AM) and the through insulator vias 108 are encapsulated by and well protected by the insulating material 110. In other words, the conductive posts (106*a*-4/106*b*-4), the alignment mark (106*a*-AM/106*b*-AM) and the through insulator vias 108 are not revealed.

In some embodiments, the insulating material 110 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 110 may include an acceptable insulating encapsulation material. In some embodiments, the insulating material 110 may further include inorganic filler or inorganic compound (e.g. silica, clay, and so on) which can be added therein to optimize coefficient of thermal expansion (CTE) of the insulating material 110. The disclosure is not limited thereto.

Figure 1D:
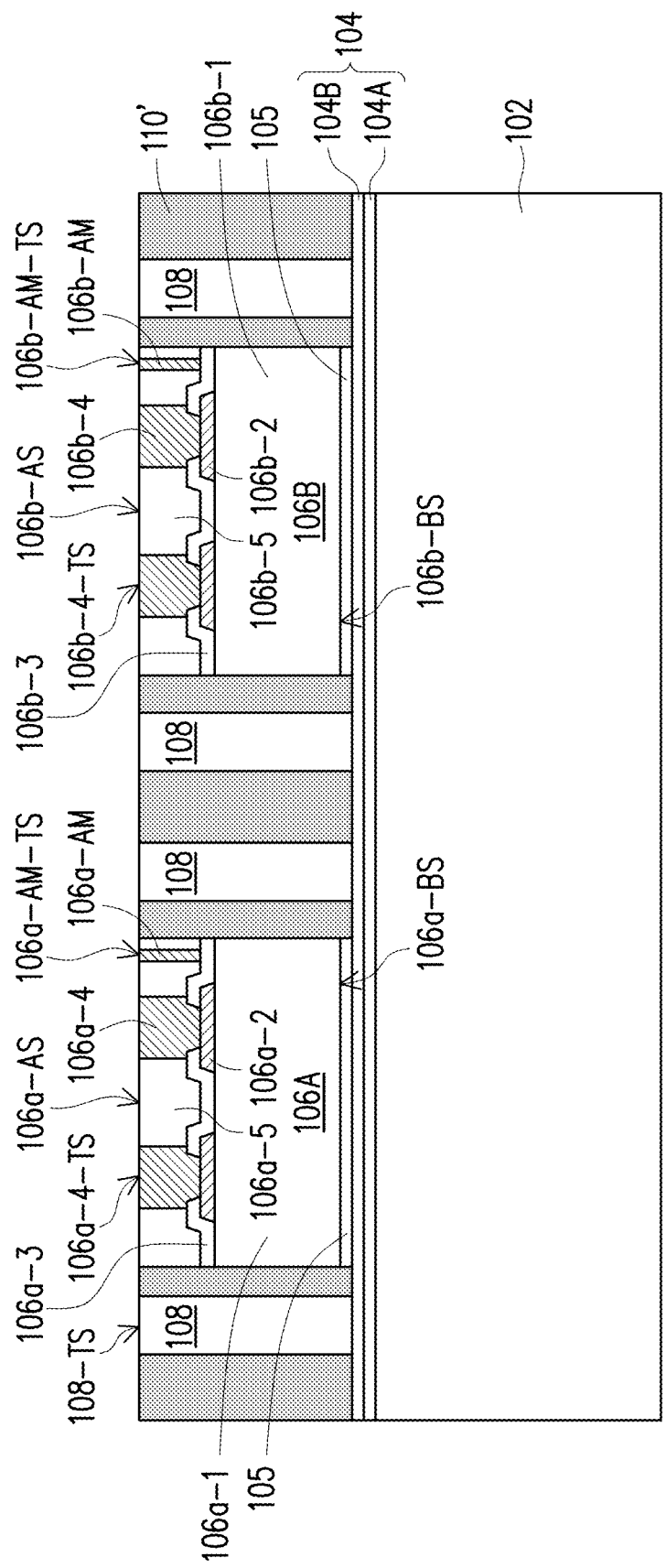

Referring to FIG. 1D, in some embodiments, the insulating material 110 is partially removed to expose the conductive posts (106*a*-4/106*b*-4), the alignment mark (106*a*-AM/106*b*-AM) and the through insulator vias 108. In some embodiments, the insulating material 110 and the protection layer (106*a*-5/106*b*-5) are ground or polished by a planarization step. For example, the planarization step is performed through a mechanical grinding process and/or a chemical mechanical polishing (CMP) process until the top surfaces (106*a*-4-TS/106*b*-4-TS) of the conductive posts (106*a*-4/106*b*-4), and top surfaces (106*a*-AM-TS/106*b*-AM-TS) of the alignment mark (106*a*-AM/106*b*-AM) are revealed. In some embodiments, the through insulator vias 108 may be partially polished so that the top surfaces 108-TS of the through insulator vias 108 are substantially levelled with the top surfaces (106*a*-4-TS/106*b*-4-TS) of the conductive posts (106*a*-4/106*b*-4) and top surfaces (106*a*-AM-TS/106*b*-AM-TS) of the alignment mark (106*a*-AM/106*b*-AM), or substantially levelled with the active surface (106*a*-AS/106*b*-AS) of the first semiconductor die 106A and the second semiconductor die 106B. In other words, the conductive posts (106*a*-4/106*b*-4), the alignment mark (106*a*-AM/106*b*-AM) and the through insulator vias 108 may also be slightly grinded/polished. In the illustrated embodiment, the insulating material 110 is polished to form the insulating encapsulant 110'.

Figure 1E:
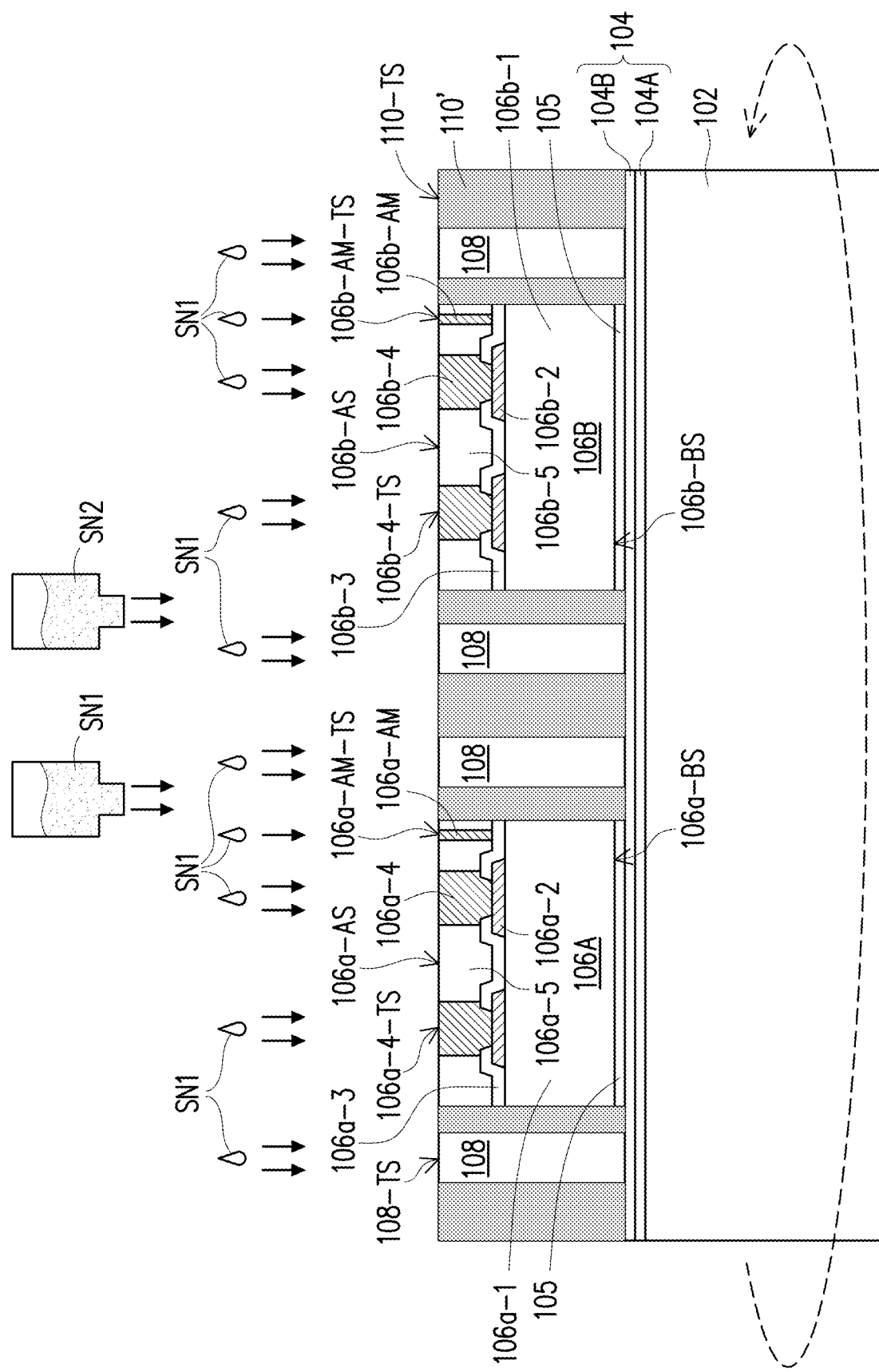

Referring to FIG. 1E, in some embodiments, after the mechanical grinding or chemical mechanical polishing (CMP) steps, a cleaning process may be performed. For example, the cleaning process is preformed to clean and remove the residue generated from the planarization step, and to form substantially planar and smooth surfaces. In some embodiments, the cleaning process includes a first cleaning step of cleaning the top surfaces (106*a*-4-TS/106*b*-4-TS) of the conductive posts (106*a*-4/106*b*-4), cleaning the top surfaces (106*a*-AM-TS/106*b*-AM-TS) of the alignment mark (106*a*-AM/106*b*-AM) and cleaning the top surfaces 108-TS of the through insulator vias 108 with a first solution SN1 for 20 seconds to 80 seconds. For example, in certain embodiments, a single wafer spin cleaning process is performed as the first cleaning step by dropping the first solution SN1 onto the top surfaces (106*a*-4-TS/106*b*-4-TS) of the conductive posts (106*a*-4/106*b*-4) while spinning the carrier 102 for 20 seconds to 80 seconds to clean the top surface (106*a*-4-TS/106*b*-4-TS) of the conductive posts (106*a*-4/106*b*-4). The top surfaces (106*a*-AM-TS/106*b*-AM-TS) of the alignment mark (106*a*-AM/106*b*-AM) and the top surfaces 108-TS of the through insulator vias 108 may be cleaned in a similar manner using the single wafer spin cleaning process. In some embodiments, the first cleaning step is performed with the first solution SN1 for at least 20 seconds to ensure that the roughness of the applied surfaces are reduced to a certain degree, and the first cleaning step is performed with the first solution SN1 for less than 80 seconds to prevent over etching or damages to the applied surfaces.

In some embodiments, a pH of the first solution SN1 is in a range of pH 0.5 to pH 5. In some embodiments, the first solution SN1 includes at least one acid selected from the group consisting of acetic acid, formic acid, citric acid, ascorbic acid, hydrofluoric acid, hydrochloric acid, phosphoric acid and nitric acid. In some embodiments, a concentration of the acid is in a range of 0.05% to 10% by weight. In some alternative embodiments, the first solution SN1 comprises at least one amine-based solution selected from the group consisting of ethanolamine, hydroxyethyl ethylenediamine, ammonium hydroxide and ammonium chloride. In some embodiments, a concentration of the amine-based solution is in a range of 10% to 35% by weight. In certain embodiments, the acid and amine-based solution mentioned above may be used alone, or used in combination in the first solution SN1. In one exemplary embodiment, the first solution SN1 is a citric acid solution.

Furthermore, in some embodiments, the cleaning process may optionally include a second cleaning step of cleaning the top surfaces (106*a*-4-TS/106*b*-4-TS) of the conductive posts (106*a*-4/106*b*-4), cleaning the top surfaces (106*a*-AM-TS/106*b*-AM-TS) of the alignment mark (106*a*-AM/106*b*-AM) and cleaning the top surfaces 108-TS of the through insulator vias 108 with a second solution SN2 for 20 seconds to 80 seconds. For example, in certain embodiments, another single wafer spin cleaning process may be performed as the second cleaning step by dropping the second solution SN2 onto the top surfaces (106*a*-4-TS/106*b*-4-TS) of the conductive posts (106*a*-4/106*b*-4) while spinning the carrier 102 for 20 seconds to 80 seconds to clean the top surface (106*a*-4-TS/106*b*-4-TS) of the conductive posts (106*a*-4/106*b*-4). The top surfaces (106*a*-AM-TS/106*b*-AM-TS) of the alignment mark (106*a*-AM/106*b*-AM) and the top surfaces 108-TS of the through insulator vias 108 may be cleaned in a similar way using the single wafer spin cleaning process. In some embodiments, the second cleaning step is performed with the second solution SN2 for at least 20 seconds to ensure that the roughness of the applied surfaces are reduced to a certain degree, and the second cleaning step is performed with the second solution SN2 for less than 80 seconds to prevent over etching or damages to the applied surfaces.

In some embodiments, a pH of the second solution SN2 is in a range of pH 1.5 to pH 6. In some embodiments, the second solution SN2 includes at least one acid selected from the group consisting of acetic acid, formic acid, citric acid, ascorbic acid, hydrofluoric acid, hydrochloric acid, phosphoric acid and nitric acid. In some embodiments, a concentration of the acid is in a range of 0.01% to 3% by weight. In some alternative embodiments, the second solution SN2 comprises at least one amine-based solution selected from the group consisting of ethanolamine, hydroxyethyl ethylenediamine, ammonium hydroxide and ammonium chloride. In some embodiments, a concentration of the amine-based solution is in a range of 10% to 35% by weight. In certain embodiments, the acid and amine-based solution mentioned above may be used alone, or used in combination in the second solution SN2. In some embodiments, the second solution SN2 may be the same as the first solution SN1. In alternative embodiments, the second solution SN2 may be different than the first solution SN1.

After performing the cleaning process (single wafer spin cleaning process), the top surface (106a-4-TS/106b-4-TS) of the plurality of conductive posts (106a-4/106b-4) may have a roughness Rg1. In some embodiments, the roughness of the top surface (106a-4-TS/106b-4-TS) of the plurality of conductive posts (106a-4/106b-4) prior to the cleaning process is in a range of 1.5 μm to 5 μm. In certain embodiments, the roughness Rg1 after the cleaning process is in a range of 0.1 μm to 1 μm. In some embodiments, the top surfaces (106a-AM-TS/106b-AM-TS) of the alignment mark (106a-AM/106b-AM) may have a roughness Rg2, and the top surfaces 108-TS of the through insulator vias 108 may have a roughness Rg3. For example, the roughness Rg2 and the roughness Rg3 may be substantially equal to the roughness Rg1. In some embodiments, a top surface 110-TS of the insulating encapsulant 110', the top surface 108-TS of the through insulator vias 108, the top surfaces (106a-4-TS/106b-4-TS) of the conductive posts (106a-4/106b-4), the top surfaces (106a-AM-TS/106b-AM-TS) of the alignment mark (106a-AM/106b-AM) and the top surface of the polished protection layer (106a-5/106b-5), are substantially coplanar and levelled with one another after the cleaning process.

Figure 1F:
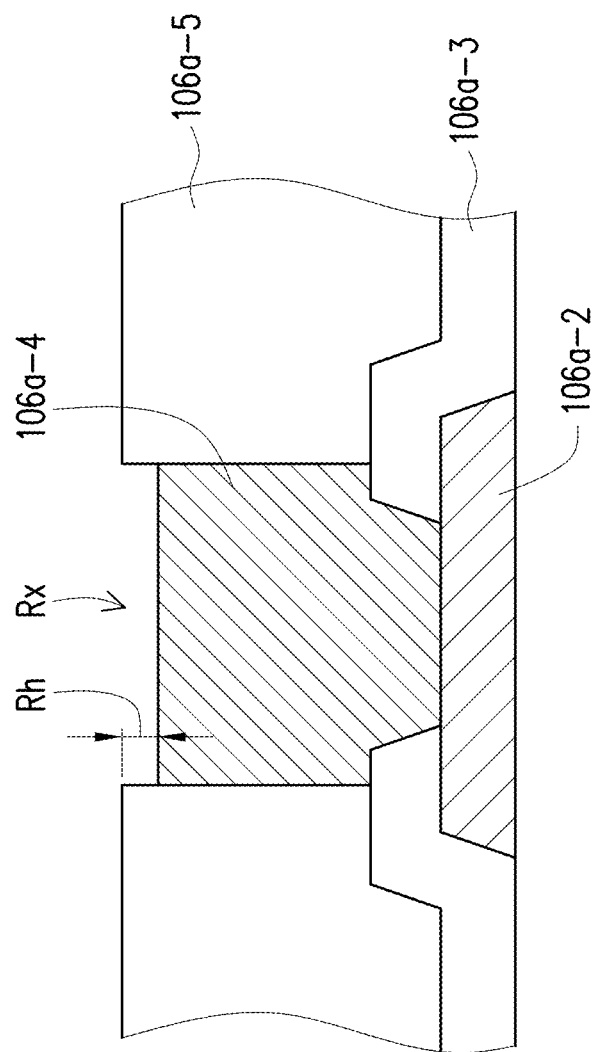
Figure 1G:
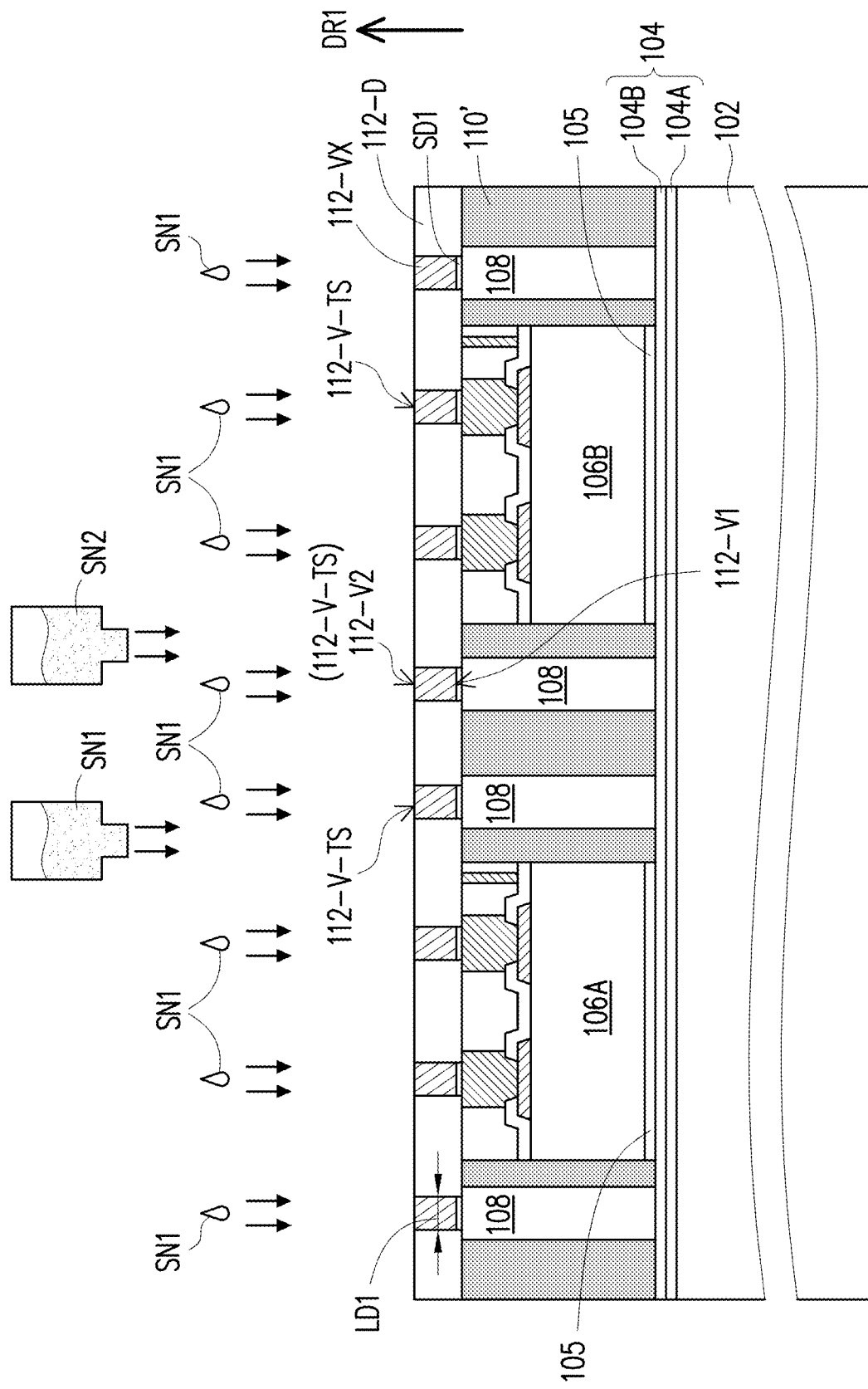

FIG. 1F is an enlarged sectional view of the semiconductor die 106A after the cleaning process in accordance with some other embodiments of the present disclosure. As illustrated in FIG. 1G, in some embodiments, a recess Rx may exist in the protection layer 106a-5 after the cleaning process. In other words, a step height difference may exist in between the protection layer 106a-5 and the conductive posts 106a-4. In certain embodiments, the recess Rx may have a recess height Rh in a range of 0.1 μm to 5.0 μm. However, the disclosure is not limited thereto. In some alternative embodiments, no recess exists in the protection layer 106a-5, and the protection layer 106a-5 and the conductive posts 106a-4 are substantially coplanar.

Figure 1H:
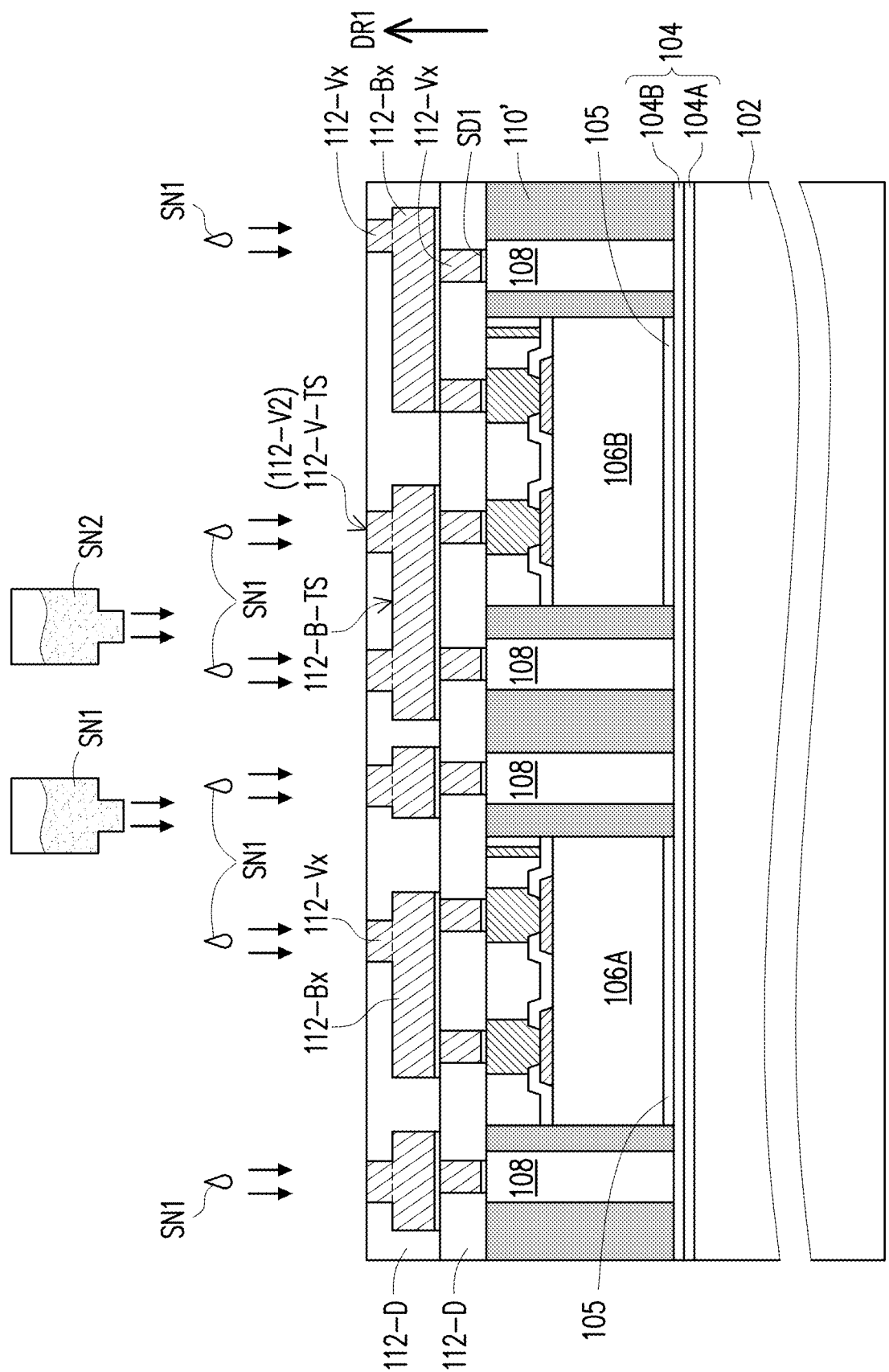

Referring to FIG. 1G and FIG. 1H, the steps of forming a redistribution structure on the insulating encapsulant 110' is described. As illustrated in FIG. 1G, in a first step, a plurality of conductive via portions (first via portions 112-Vx) is formed over the conductive posts (106a-4/106b-4) and over the through insulator vias 108 in a build-up direction DR1. In some embodiments, the conductive via portions (first via portions 112-Vx) are formed by forming a planar seed layer SD1 over the insulating encapsulant 110'; forming a mask pattern with openings exposing portions of the planar seed layer SD1; forming a conductive material on the exposed portions of the planar seed layer SD1 to form the conductive via portions (first via portions 112-Vx) by plating; removing the mask pattern; and then removing portions of the planar seed layer SD1 exposed by the conductive via portions (first via portions 112-Vx). Thereafter, a dielectric material (not shown) may be formed to cover the conductive via portions (first via portions 112-Vx), wherein the dielectric material is further ground or polished by a planarization step to form a dielectric layer 112-D. In some embodiments, the planarization step is performed through a mechanical grinding process and/or a chemical mechanical polishing (CMP) process until the top surfaces 112-V-TS of the conductive via portions (first via portions 112-Vx) are revealed.

In the illustrated embodiment, the conductive via portions (first via portions 112-Vx) are formed with a lateral dimension LD1 that is kept constant from a first end 112-V1 to a second end 112-V2 of the conductive via portions (first via portions 112-Vx) in the build-up direction DR1. In some embodiments, after the planarization step, a via cleaning process (such as single wafer spin cleaning process) may be performed to clean the top surfaces 112-V-TS of the second end 112-V2 of the conductive via portions (first via portions 112-Vx) with the first solution SN1 for 20 seconds to 80 seconds to form substantially planar and smooth surfaces. In certain embodiments, another via cleaning process (such as single wafer spin cleaning process) may be optionally performed to clean the top surfaces 112-V-TS of the second end 112-V2 of the conductive via portions with the second solution SN2 for 20 seconds to 80 seconds to form substantially planar and smooth surfaces. The first solution SN1 and the second solution SN2 mentioned herein is the same as that mentioned in FIG. 1E, hence its detailed description will be omitted herein. After the via cleaning process, the top surfaces 112-V-TS of the second end 112-V2 of the conductive via portions (first via portions 112-Vx) may have a roughness Rg4. For example, the roughness Rg4 after the via cleaning process is in a range of 0.1 μm to 1 μm. In certain embodiments, the roughness Rg4 may be substantially equal to the roughness Rg1.

Referring to FIG. 1H, in a next step, a planar seed layer SD1, a plurality of conductive body portions 112-Bx, a plurality of conductive via portions (first via portions 112-Vx), and a second dielectric layer 112-D may be formed and stacked up in the build-up direction DR1 in a similar way described in FIG. 1G above by performing plating and planarization processes. In the exemplary embodiment, the top surfaces 112-V-TS of the conductive via portions (first via portions 112-Vx) embedded in the second dielectric layer 112-D are revealed after the planarization process. Thereafter, the same via cleaning process may be preformed to clean the surface of the uppermost conductive via portions (first via portions 112-Vx) by using the first solution SN1 and optionally the second solution SN1 for cleaning. As such, after the via cleaning process, the top surfaces 112-V-TS of the second end 112-V2 of the conductive via portions (first via portions 112-Vx) may have a roughness Rg4. On the other hand, since the top surface 112-B-TS of the conductive body portions 112-Bx are covered up by the dielectric layer 112-D and not cleaned by the via cleaning process, it may have a roughness Rg5, wherein roughness Rg5 is greater than the roughness Rg4. In some embodiments, the roughness Rg1, the roughness Rg2, the roughness Rg3, roughness Rg4 are all smaller than the roughness Rg5.

Figure 1I:
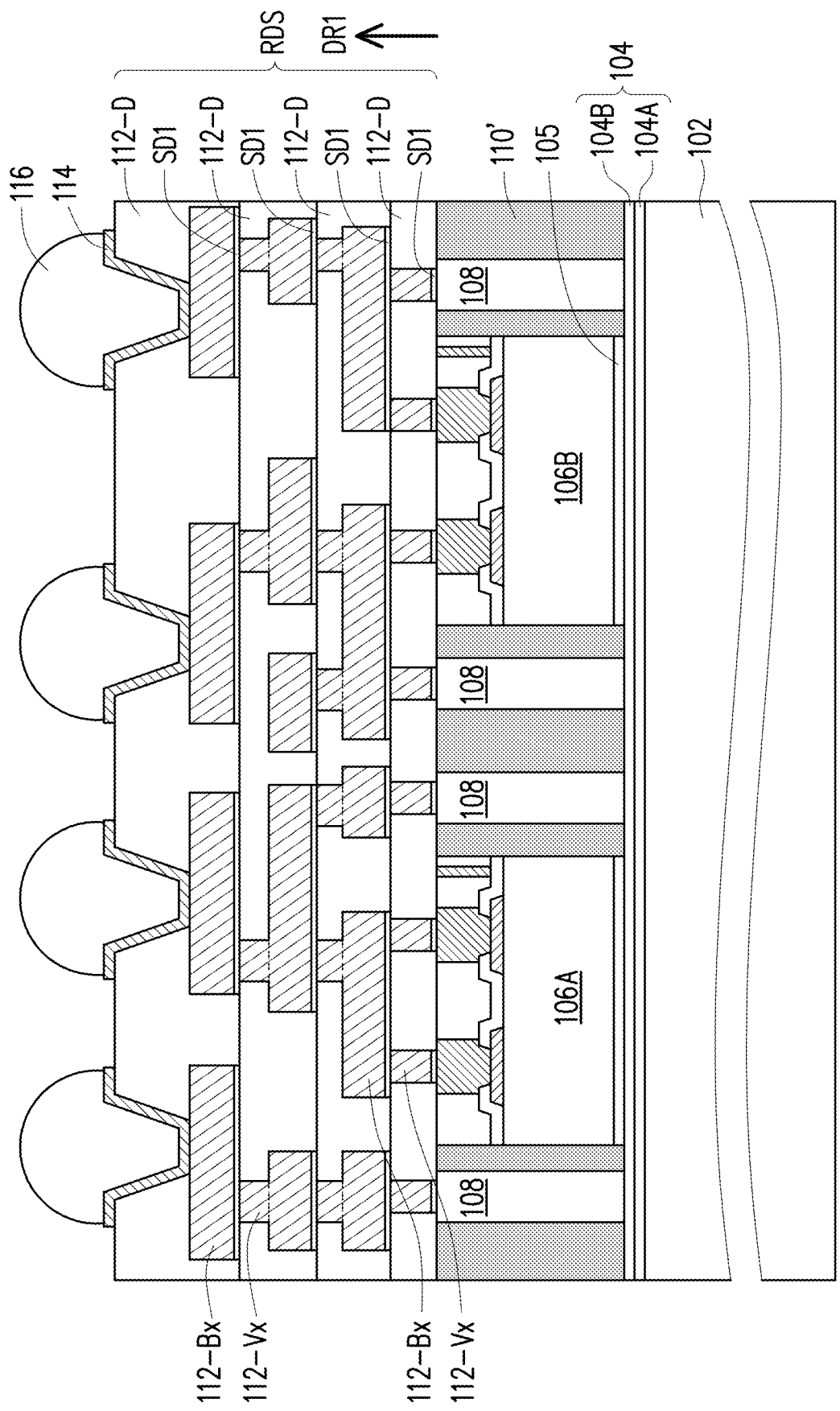

Referring to FIG. 1I, in some embodiments, the formation of the planar seed layer SD1, the conductive via portions (first via portions 112-Vx), the conductive body portions 112-Bx and the dielectric layers 112-D described in FIG. 1G and FIG. 1H may then be repeated to form the redistribution structure RDS. In some embodiments, the planar seed layer SD1, the conductive via portions (first via portions 112-Vx), the conductive body portions 112-Bx and the dielectric layers 112-D are alternately stacked in the build-up direction DR1 to constitute the redistribution structure RDS. Furthermore, in the exemplary embodiment, all the conductive via portions (first via portions 112-Vx) may have top surfaces 112-V-TS with the roughness Rg4, while the conductive body portions 112-Bx may have top surfaces 112-B-TS with the roughness Rg5, and roughness Rg4 is smaller than roughness Rg5. In some embodiments, portions of the planar seed layers SD1 may be disposed on and in physical contact with the conductive via portions (first via portions 112-Vx).

As shown in FIG. 1I, although three layers of conductive via portions (first via portions 112-Vx)/conductive body portions 112-Bx and four layers of dielectric layers 112-D are illustrated herein, however, the scope of the disclosure is not limited thereto. In other embodiments, the number of layers of conductive via portions (first via portions 112-Vx)/conductive body portions 112-Bx and dielectric layers 112-D may be adjusted based on product requirement. In some embodiments, the redistribution structure RDS is electrically connected to the through insulator vias 108 and the semiconductor dies (106A/106B) through the conductive via portions (first via portions 112-Vx) and the conductive body portions 112-Bx.

In the exemplary embodiment, the material of the dielectric layer 112-D may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 112-D may be formed by suitable fabrication techniques such as spin-on coating, chemical vapor deposition (CVD), plasma-enhanced chemical vapor deposition (PECVD) or the like. The disclosure is not limited thereto.

Furthermore, in some embodiments, the material of the conductive via portions (first via portions 112-Vx) and the conductive body portions 112-Bx may be made of conductive materials formed by electroplating or deposition, such as aluminum, titanium, copper, nickel, tungsten, and/or alloys thereof, which may be patterned using a photolithography and etching process. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Referring still to FIG. 1I, after forming the redistribution structure RDS, a plurality of conductive pads 114 may be disposed on an exposed top surface of the topmost layer of the conductive body portions 112-Bx for electrically connecting with conductive balls (or conductive bumps). In some embodiments, the conductive pads 114 are for example, under-ball metallurgy (UBM) patterns used for ball mount. As shown in FIG. 1I, the conductive pads 114 are formed on and electrically connected to the redistribution structure RDS. In some embodiments, the materials of the conductive pads 114 may include copper, nickel, titanium, tungsten, or alloys thereof or the like, and may be formed by an electroplating process, for example. The number of conductive pads 114 are not limited in this disclosure, and may be selected based on the design layout. In some alternative embodiments, the conductive pads 114 may be omitted. In other words, conductive balls 116 (or conductive bumps) formed in subsequent steps may be directly disposed on the redistribution structure RDS.

After forming the conductive pads 114, a plurality of conductive balls 116 is disposed on the conductive pads 114 and over the redistribution structure RDS. In some embodiments, the conductive balls 116 may be disposed on the conductive pads 116 by a ball placement process or reflow process. In some embodiments, the conductive balls 116 are, for example, solder balls or ball grid array (BGA) balls. In some embodiments, the conductive balls 116 are connected to the redistribution structure RDS through the conductive pads 114. In certain embodiments, some of the conductive balls 116 may be electrically connected to the semiconductor dies (106A/106B) through the redistribution structure RDS. Furthermore, some of the conductive balls 116 may be electrically connected to the through insulator vias 108 through the redistribution structure RDS. The number of the conductive balls 116 is not limited to the disclosure, and may be designated and selected based on the number of the conductive pads 114.

Figure 1J:
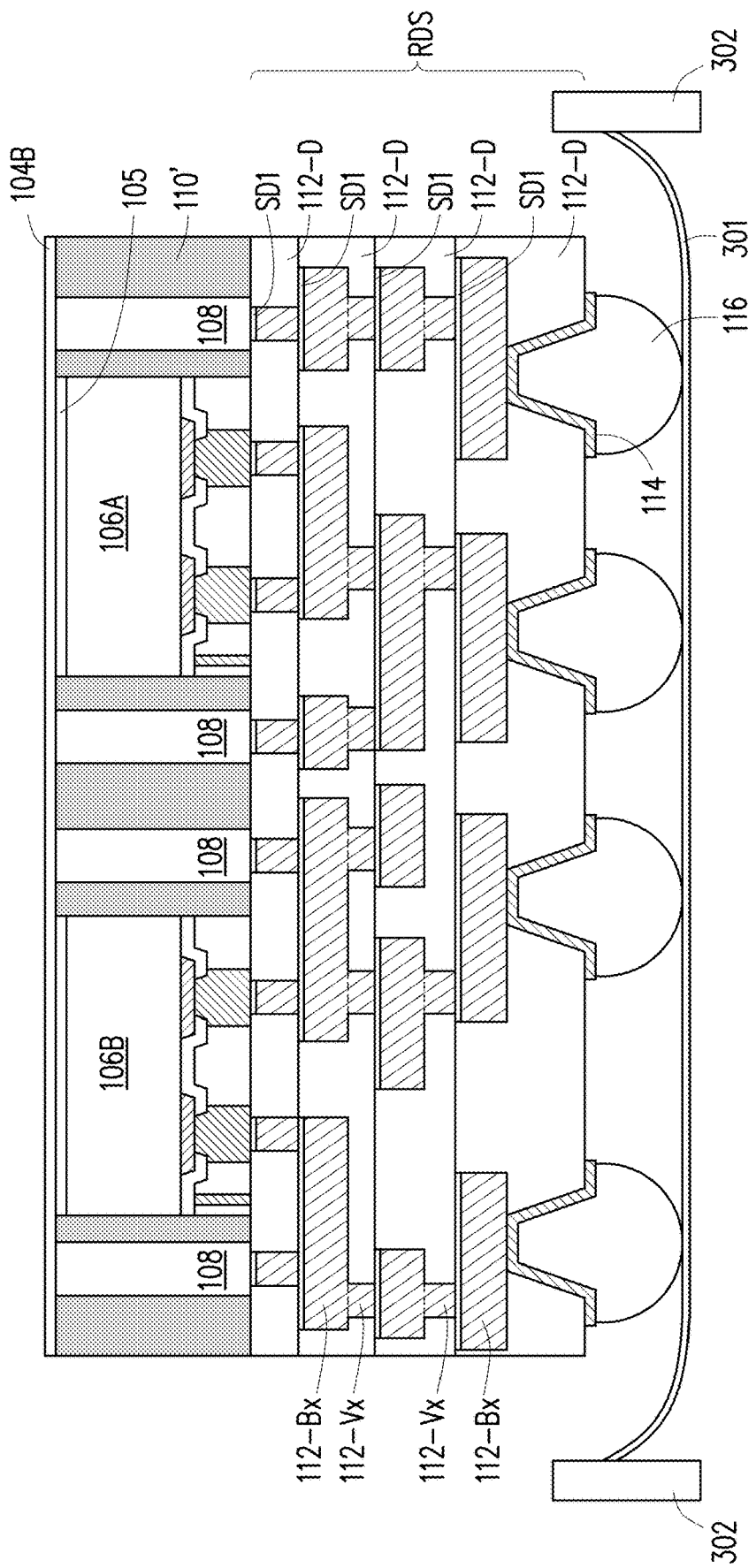

Referring to FIG. 1J, in some embodiments, after forming the redistribution structure RDS and the conductive balls 116, the structure shown in FIG. 1I may be turned upside down and attached to a tape 301 (e.g., a dicing tape) supported by a frame 302. As illustrated in FIG. 1J, the carrier 102 is debonded and is separated from the dielectric layer 104B. In some embodiments, the de-bonding process includes projecting a light such as a laser light or an UV light on the de-bonding layer 104A (e.g., the LTHC release layer) so that the carrier 102 can be easily removed along with the de-bonding layer 104A. During the de-bonding step, the tape 301 is used to secure the package structure before de-bonding the carrier 102 and the de-bonding layer 104A. After the de-bonding process, a backside surface of the dielectric layer 104B is revealed or exposed.

Figure 1K:
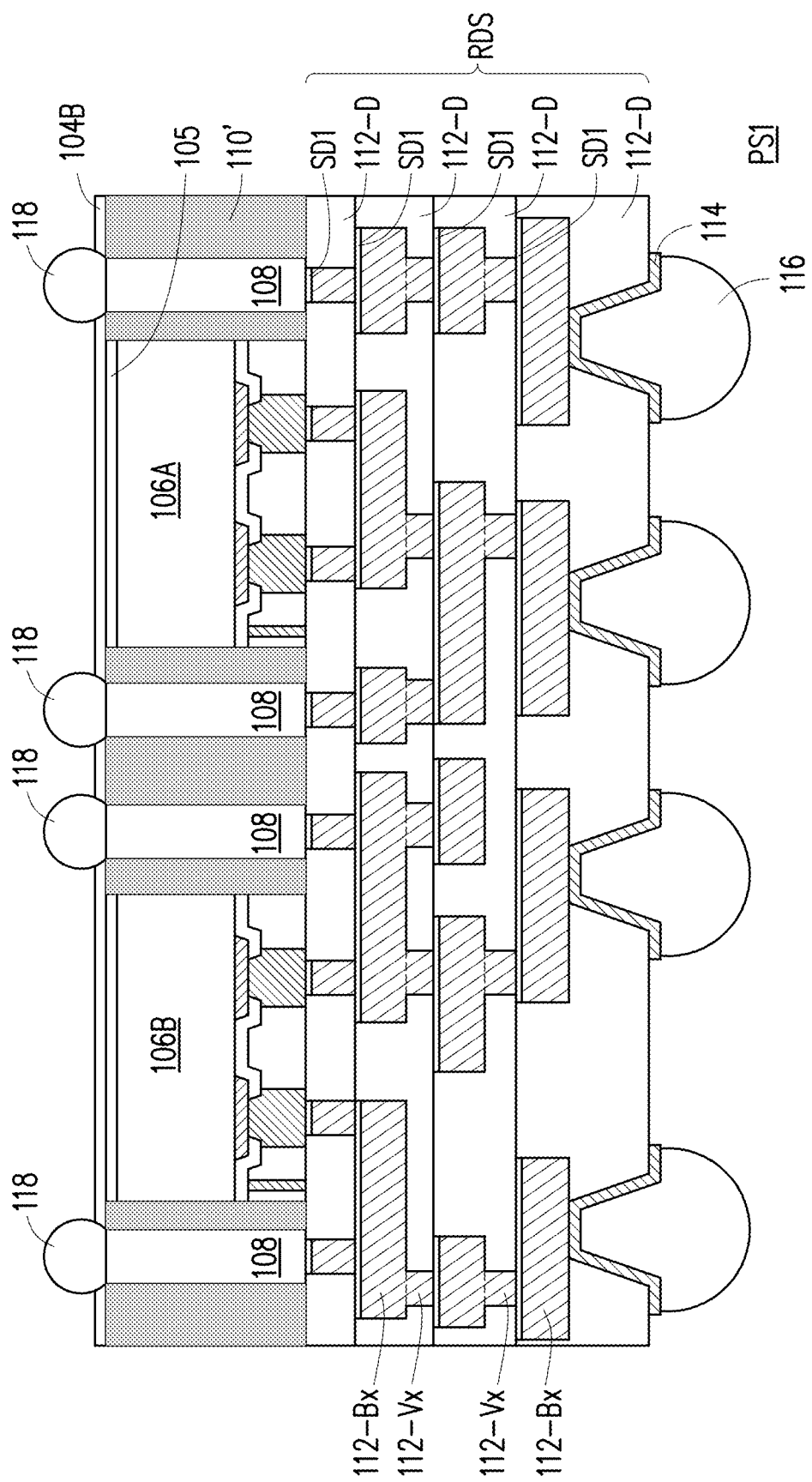

Referring to FIG. 1K, in some embodiments, after the de-bonding process, the dielectric layer 104B may be patterned to form a plurality of openings (not shown) that expose the bottom surfaces of the through insulator vias 108. The number of openings formed is corresponding to the number of the through insulator vias 108. Thereafter, a plurality of conductive balls 118 may be placed on the bottom surface of the through insulator vias 108 exposed by the openings. The conductive balls 118 are, for example, reflowed to bond with the bottom surfaces of the through insulator vias 108. Subsequently, a dicing process may be performed to cut the whole wafer structure (cutting through the redistribution structure RDS, the insulating encapsulant 110' and the dielectric layer 104B) into a plurality of package structures PS1. Up to here, a package structures PS1 having dual side terminals according to some embodiments of the present disclosure is accomplished.

FIG. 2A to FIG. 2C are enlarged sectional views of a semiconductor die at various stages in a method of fabricating a package structure according to some exemplary embodiments of the present disclosure. The method described herein is similar to the method described in FIG. 1C to FIG. 1F, hence the same reference numerals are used to refer to the same or liked parts, and its detailed description will be omitted herein. The difference between the embodiments is in the design of the conductive posts (106a-4/106b-4). In the embodiment shown in FIG. 1C to FIG. 1F, the conductive posts (106a-4/106b-4) are made of a single material (e.g. copper posts). However, the disclosure is not limited thereto, and the conductive posts (106a-4/106b-4) may be made of a plurality of materials.

For example, referring to FIG. 2A, in some embodiments, prior to performing the planarization process (corresponding to the step shown in FIG. 1C), the conductive posts 106a-4 of the first semiconductor die 106A may include a first metal layer M1, a second metal layer M2, a third metal layer M3 and a solder layer Mx. In one exemplary embodiment, the first metal layer M1 is a copper layer, the second metal layer is a nickel layer, and the third metal layer M3 is a copper layer. Furthermore, at this stage, the protection layer 106a-5 completely covers the conductive posts 106a-4.

Referring to FIG. 2B, a planarization step is performed to remove the solder layer Mx and portions of the third metal layer M3 so that a top surface (106a-4-TS) of the second metal layer M2 is revealed or exposed. In some embodiments, residual amount of the third metal layer M3 may remain on the second metal layer M2. In certain embodiments, the residual third metal layer M3 may be treated as flank portions of the second metal layer M2. In alternative embodiments, the third metal layer M3 may be completely removed by the planarization step. After performing the planarization step, a cleaning process (single wafer spin cleaning process) using the first solution SN1 (and optionally the second solution SN2) similar to that described in FIG. 1E may be performed to clean the top surface 106a-4-TS (which is the surface of the second metal layer M2) of the conductive posts 106a-4.

Referring to FIG. 2C, after performing the cleaning process, a conductive post 106a-4 having a copper layer (metal layer M1) a nickel layer (metal layer M2) and flank portions (metal layer M3) is formed. In some embodiments the top surface (106a-4-TS) of the nickel layer (metal layer M2) has the first roughness Rg1. In certain embodiments, the roughness Rg1 after the cleaning process is in a range of 0.1 μm to 1 μm. In certain embodiments, the top surface (106a-4-TS) of the nickel layer (metal layer M2) is substantially coplanar with a top surface of the flank portions (metal layer M3), and a top surface of the protection layer 106a-5. Thereafter, the same steps described in FIG. 1G to FIG. 1K may be performed to form a redistribution structure RDS thereon, and to complete the formation of the package structure.

Figure 3:
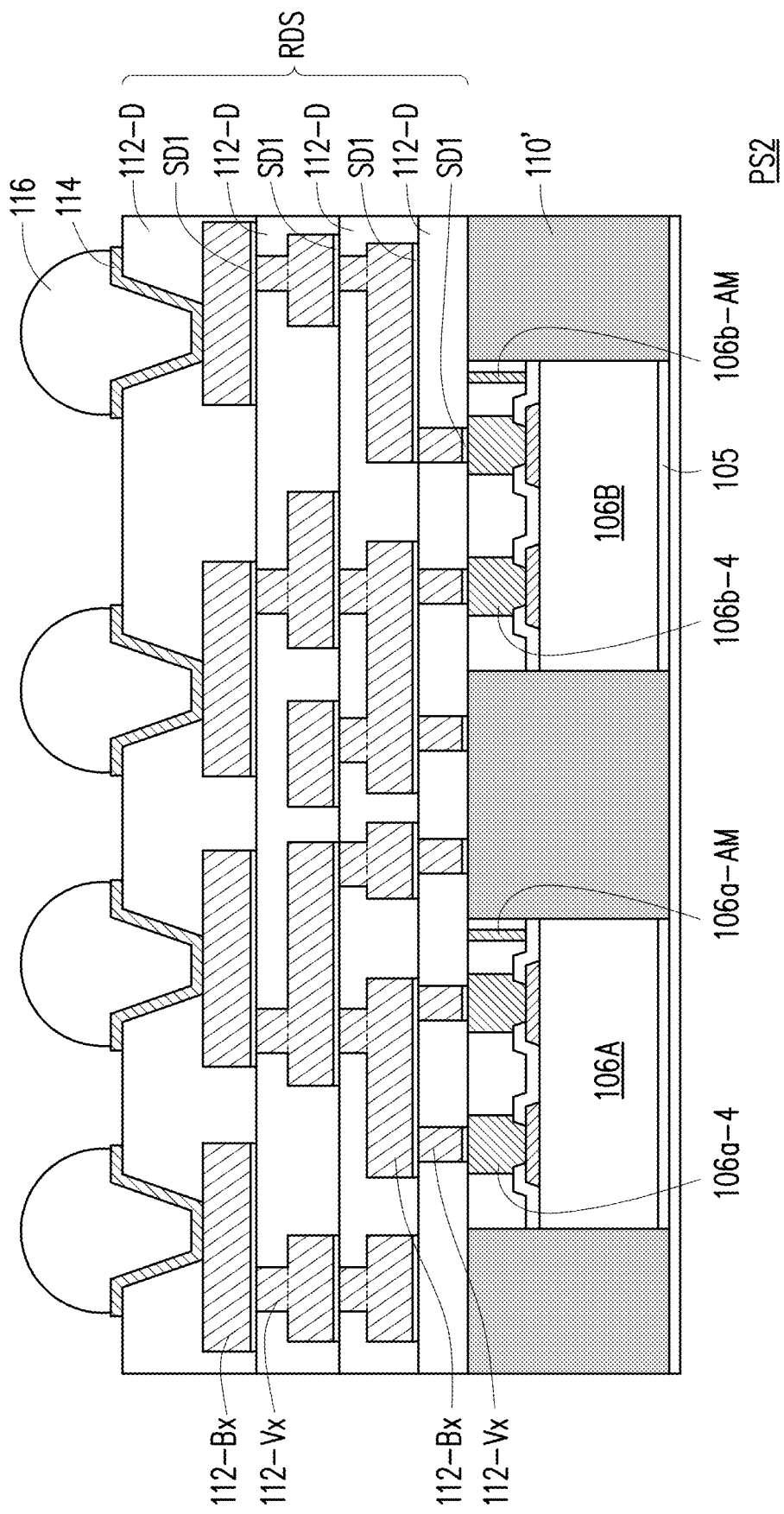
FIG. 3 is a schematic sectional view of a package structure according to some other exemplary embodiments of the present disclosure.

FIG. 3 is a schematic sectional view of a package structure according to some other exemplary embodiments of the present disclosure. The package structure PS2 illustrated in FIG. 3 is similar to the package structure PS1 illustrated in FIG. 1K, hence, the same reference numerals are used to refer to the same or liked parts, and its detailed description will be omitted herein. The difference between the embodiments is that the through insulator vias 108 are omitted in FIG. 3. Since the through insulator vias 108 are omitted in the package structure PS2, the conductive balls 118 placed on the through insulator vias 108 may also be omitted. Similar to the embodiments above, cleaning processes (single wafer spin cleaning process) are performed to treat the surfaces of the conductive posts (106a-4/106b-4), the alignment mark (106a-AM/106b-AM) and the first via portions 112-Vx. Therefore, the surfaces of the conductive posts (106a-4/106b-4), the alignment mark (106a-AM/106b-AM), and the first via portions 112-Vx may have a smaller roughness, and a collapse issue of vias or connection structures formed thereon may be prevented.

Figure 4:
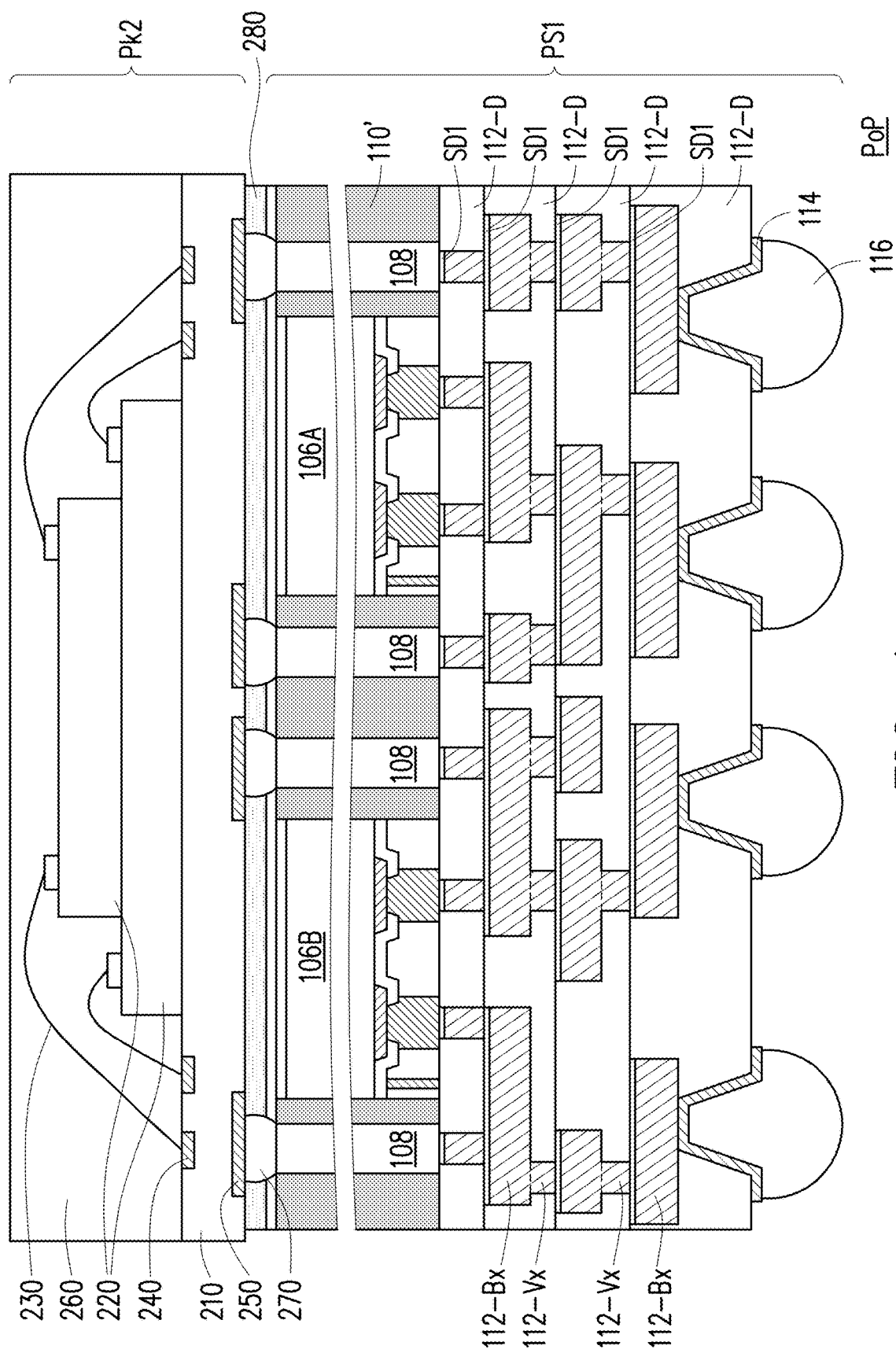
FIG. 4 is a schematic sectional view of a package-on-package (PoP) structure according to some exemplary embodiments of the present disclosure.

FIG. 4 is a schematic sectional view of a package-on-package (PoP) structure according to some exemplary embodiments of the present disclosure. Referring to FIG. 4, after fabricating a first package, such as the package structure PS1 illustrated in FIG. 1K, a second package Pk2 may be stacked on the package structure PS1 (first package) so as to form a package-on-package (PoP) structure. In some embodiments, the conductive balls 118 are omitted from the package structure PS1, so that the second package Pk2 may be stacked on and electrically connected to the package structure PS1 through conductive balls 270. As illustrated in FIG. 4, the second package Pk2 is electrically connected to the through insulator vias 108 of the package structure PS1 through the conductive balls 270.

In some embodiments, the second package Pk2 has a substrate 210, a plurality of semiconductor chips 220 mounted on one surface (e.g. top surface) of the substrate 210 and stacked on top of one another. In some embodiments, bonding wires 230 are used to provide electrical connections between the semiconductor chips 220 and pads 240 (such as bonding pads). In some embodiments, an insulating encapsulant 260 is formed to encapsulate the semiconductor chips 220 and the bonding wires 230 to protect these components. In some embodiments, through insulator vias (not shown) may be used to provide electrical connection between the pads 240 and conductive pads 250 (such as bonding pads) that are located on another surface (e.g. bottom surface) of the substrate 210. In certain embodiments, the conductive pads 250 are electrically connected to the semiconductor chips 220 through these through insulator vias (not shown). In some embodiments, the conductive pads 250 of the package structure Pk2 are electrically connected to the conductive balls 270. In some embodiments, an underfill 280 is further provided to fill in the spaces between the conductive balls 270 to protect the conductive balls 270. After stacking the second package Pk2 on the package structure PS1 (first package) and providing electrical connection therebetween, a package-on-package structure PoP can be fabricated.

Figure 5:
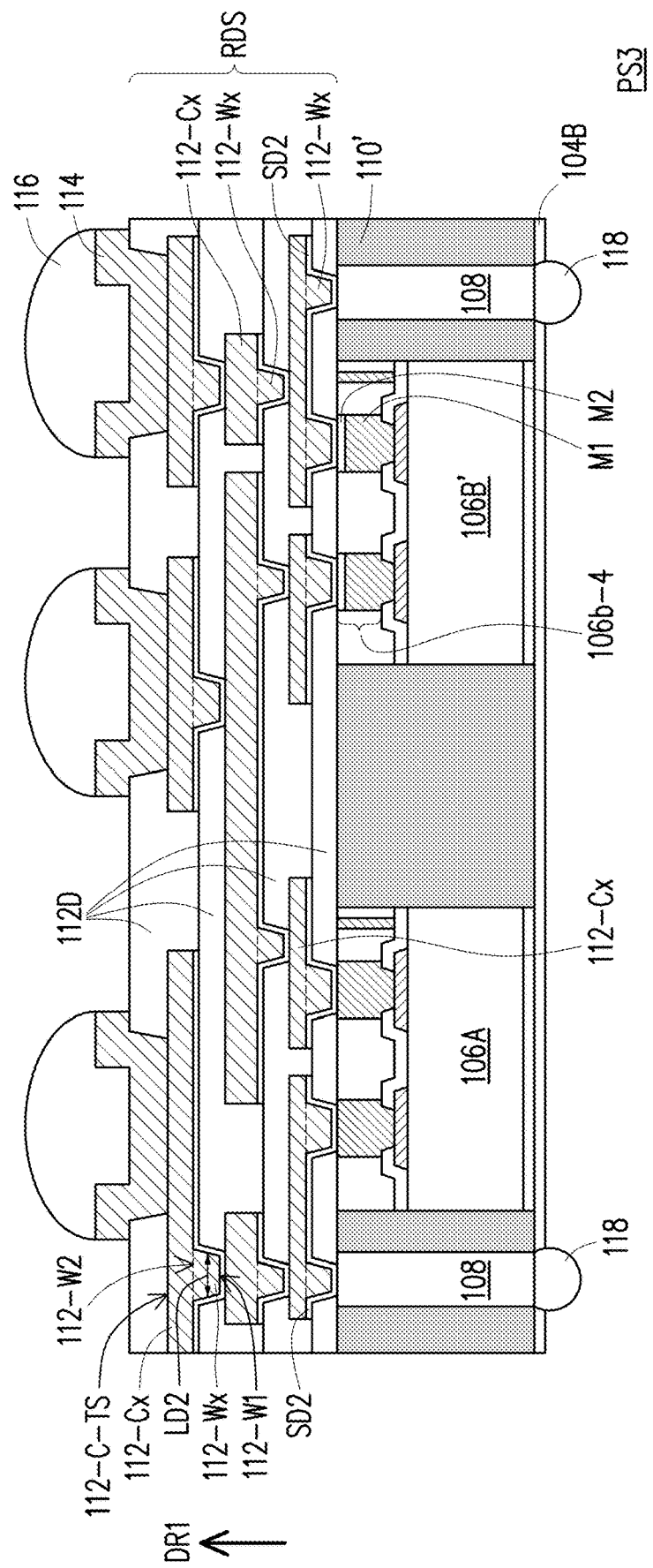
FIG. 5 is a schematic sectional view of a package structure according to some other exemplary embodiments of the present disclosure.

FIG. 5 is a schematic sectional view of a package structure according to some other exemplary embodiments of the present disclosure. The package structure PS3 illustrated in FIG. 5 is similar to the package structure PS1 illustrated in FIG. 1K, hence, the same reference numerals are used to refer to the same or liked parts, and its detailed description will be omitted herein. The difference between the embodiments is in the design of the second semiconductor die 106B' and the redistribution structure RDS. As illustrated in FIG. 5, the second semiconductor die 106B' includes a conductive post 106b-4 having a first metal layer M1 (such as a copper layer) and a second metal layer M2 (such as a nickel layer). In other words, the semiconductor die 106B' may be fabricated by the method described in FIG. 2A to FIG. 2C. For example, the top surface of the second metal layer M2 (nickel layer) may be treated with the cleaning process (single wafer spin cleaning process) and have the first roughness Rg1.

Furthermore, in the exemplary embodiment, the redistribution structure RDS is formed by forming dielectric layers 112-D, non-planar seed layers SD2, conductive via portions (second via portions 112-Wx) and conductive body portions 112-Cx that are alternately stacked. In some embodiments, the non-planar seed layers SD2 are conformally formed over a dielectric layer 112-D to have top surfaces located on different level planes. In some embodiments, the conductive via portions (second via portions 112-Wx) are disposed on and in contact with the non-planar seed layers SD2. In some embodiments, a lateral dimension LD2 of the conductive via portions (second via portions 112-Wx) increases from a first end 112-W1 to a second end 112-W2 of the conductive via portions (second via portions 112-Wx) in the build-up direction DR1. In certain embodiments, the conductive body portions 112-Cx may be directly disposed on the conductive via portions (second via portions 112-Wx), and may be formed in the same step with the conductive via portions (second via portions 112-Wx).

In some embodiments, the conductive via portions (second via portions 112-Wx) and the conductive body portions 112-Cx are made of the same materials as described for the conductive via portions (first via portions 112-Vx) and the conductive body portions 112-Bx in FIG. 1G to FIG. 1I. However, in certain embodiments, the conductive via portions (second via portions 112-Wx) and the conductive body portions 112-Cx illustrated in FIG. 5 may have a greater line width/spacing than that of the conductive via portions (first via portions 112-Vx) and the conductive body portions 112-Bx illustrated in FIG. 1G to FIG. 1I. In addition, since the conductive body portions 112-Cx and the conductive via portions (second via portions 112-Wx) are manufactured in the same step, a via cleaning process is not performed on a surface of the conductive via portions (second via portions 112-Wx). In some embodiments, a top surface 112-C-TS of the conductive body portions 112-Cx is also not cleaned by the via cleaning process, and thus may have the roughness Rg5 (same as that for conductive body portions 112-Bx).

Figure 6:
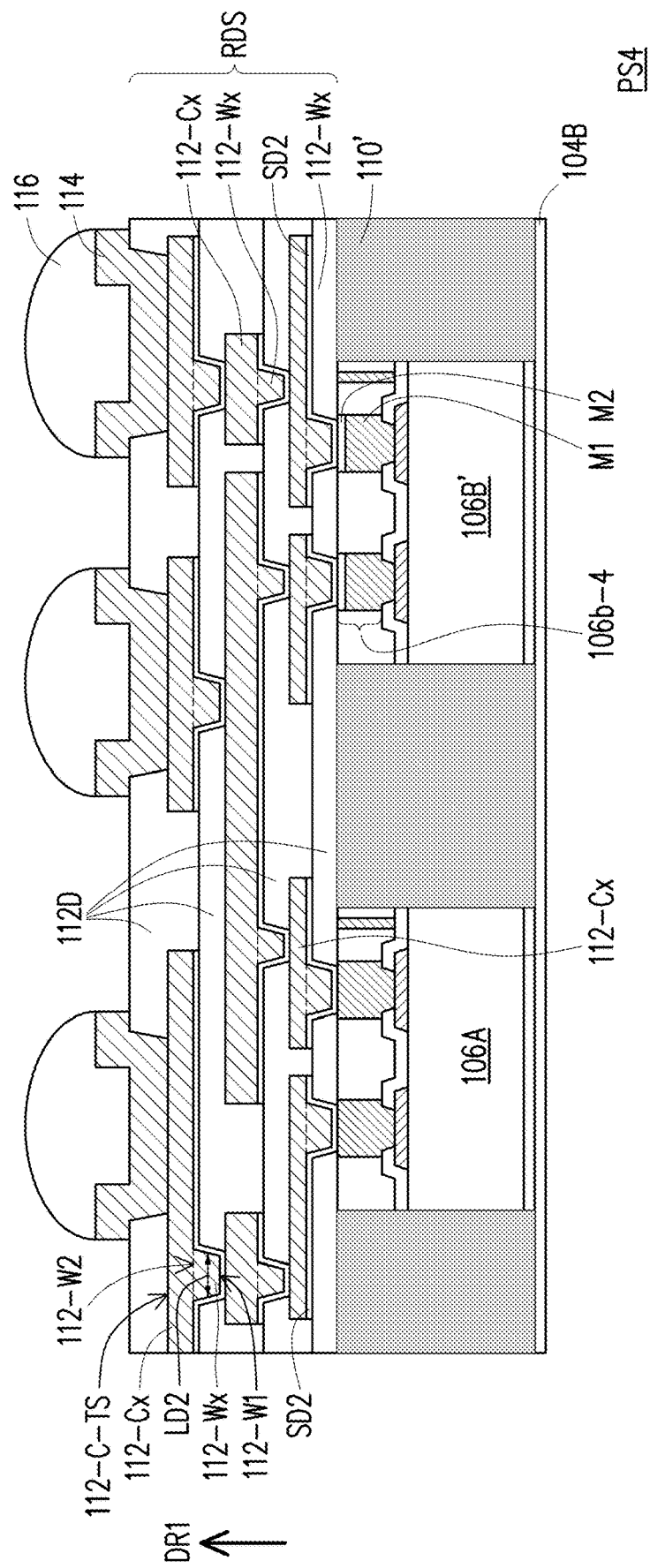
FIG. 6 is a schematic sectional view of a package structure according to some other exemplary embodiments of the present disclosure.

FIG. 6 is a schematic sectional view of a package structure according to some other exemplary embodiments of the present disclosure. The package structure PS4 illustrated in FIG. 6 is similar to the package structure PS3 illustrated in FIG. 5, hence, the same reference numerals are used to refer to the same or liked parts, and its detailed description will be omitted herein. The difference between the embodiments is that the through insulator vias 108 are omitted in FIG. 6. Since the through insulator vias 108 are omitted in the package structure PS4, the conductive balls 118 placed on the through insulator vias 108 may also be omitted. Similar to the embodiments above, cleaning processes (single wafer spin cleaning process) are performed to treat the surfaces of the conductive posts (106a-4/106b-4) and the alignment mark (106a-AM/106b-AM). Therefore, the surfaces of the conductive posts (106a-4/106b-4) and the alignment mark (106a-AM/106b-AM) may have a smaller roughness, and a collapse issue of vias or connection structures formed thereon may be prevented.

Figure 7:
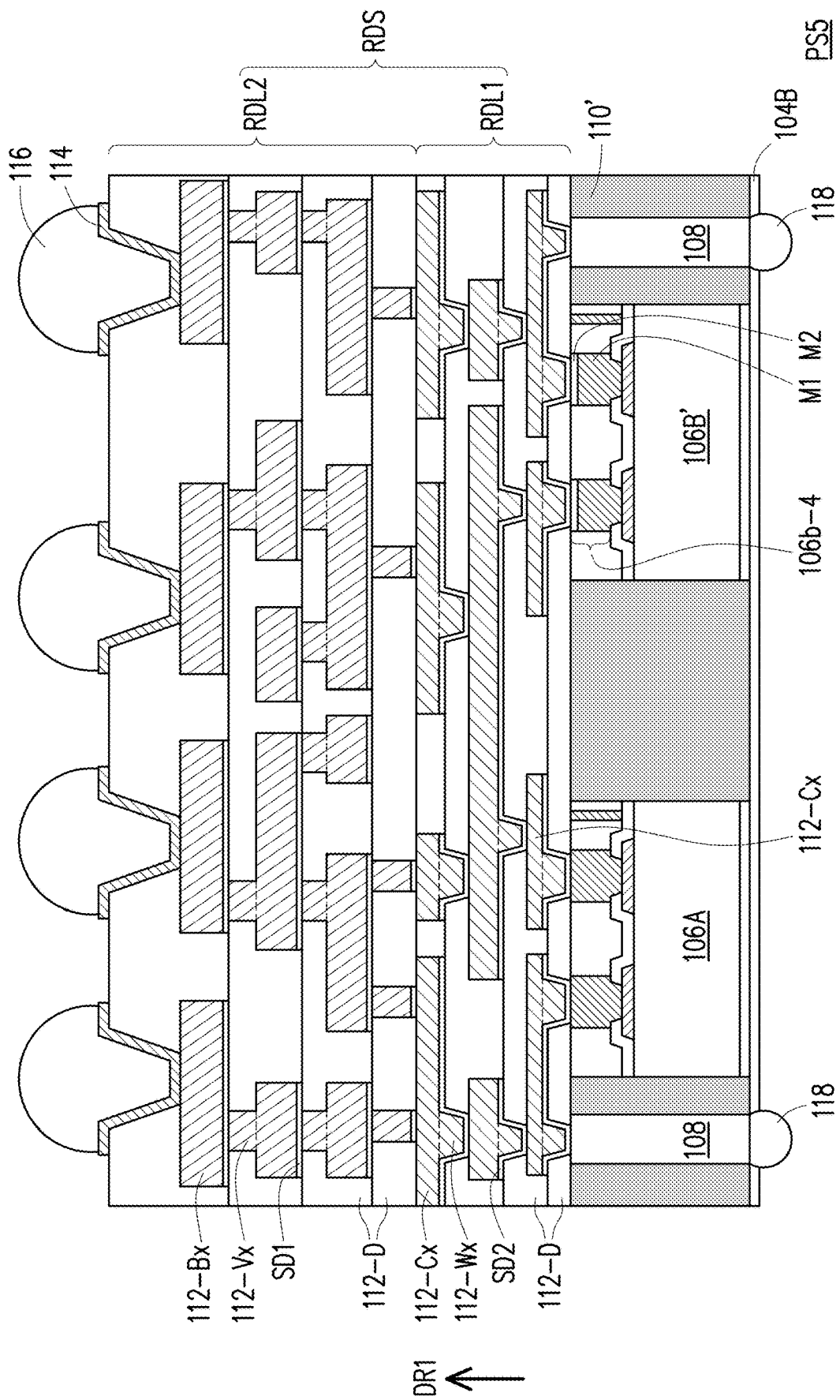
FIG. 7 is a schematic sectional view of a package structure according to some other exemplary embodiments of the present disclosure.

FIG. 7 is a schematic sectional view of a package structure according to some other exemplary embodiments of the present disclosure. The package structure PS5 illustrated in FIG. 7 is similar to the package structure PS1 illustrated in FIG. 1K and similar to the package structure PS3 illustrated in FIG. 5, hence, the same reference numerals are used to refer to the same or liked parts, and its detailed description will be omitted herein. The difference between the embodiments is in the design of the redistribution structure RDS. As illustrated in FIG. 7, the redistribution structure RDS may include a first redistribution layer RDL1 and a second redistribution layer RDL2 stacked on the first redistribution layer RDL1.

In some embodiments, the first redistribution layer RDL1 is constituted by dielectric layers 112-D, non-planar seed layers SD2, second via portions 112-Wx and conductive body portions 112-Cx as described in FIG. 5. In certain embodiments, the second redistribution layer RDL2 is constituted by dielectric layers 112-D, planar seed layers SD1, first via portions 112-Vx and conductive body portions 112-Bx as described in FIG. 1A to FIG. 1K. In other words, in the exemplary embodiment, the redistribution structure RDS may include conductive vias portions (first via portions 112-Vx/second via portions 112-Wx) with different designs. In some embodiments, the planar seed layers SD1 of the first redistribution layer RDL1 and the non-planar seed layers D2 of the second redistribution layer RDL2 are separated and not in contact with each other. In certain embodiments, the planar seed layers SD1 are disposed on and in contact with the first via portions 112-Vx, whereas the second via portions 112-Wx are disposed on and in contact with the non-planar seed layers SD2.

Similar to the embodiments above, cleaning processes (single wafer spin cleaning process) are performed to treat the surfaces of the conductive posts (106a-4/106b-4), the alignment mark (106a-AM/106b-AM), the through insulator vias 108, and the first via portions 112-Vx. Therefore, the surfaces of the conductive posts (106a-4/106b-4), the alignment mark (106a-AM/106b-AM), the through insulator vias 108, and the first via portions 112-Vx may have a smaller roughness, and a collapse issue of vias or connection structures formed thereon may be prevented. In certain embodiments, the plurality of conductive posts (106a-4/106b-4) may have a roughness Rg1, the alignment mark (106a-AM/106b-AM) may have a roughness Rg2, the through insulator vias 108 may have a roughness Rg3, the first via portions 112-Vx may have a roughness Rg4 and the conductive body portions (112-Bx/112-Cx) may have a roughness Rg5. In one exemplary embodiment, the roughness Rg5 is greater than the roughness Rg1~Rg4, whereas the roughness Rg1, the roughness Rg2, the roughness Rg3, roughness Rg4 may be substantially equal.

Figure 8:
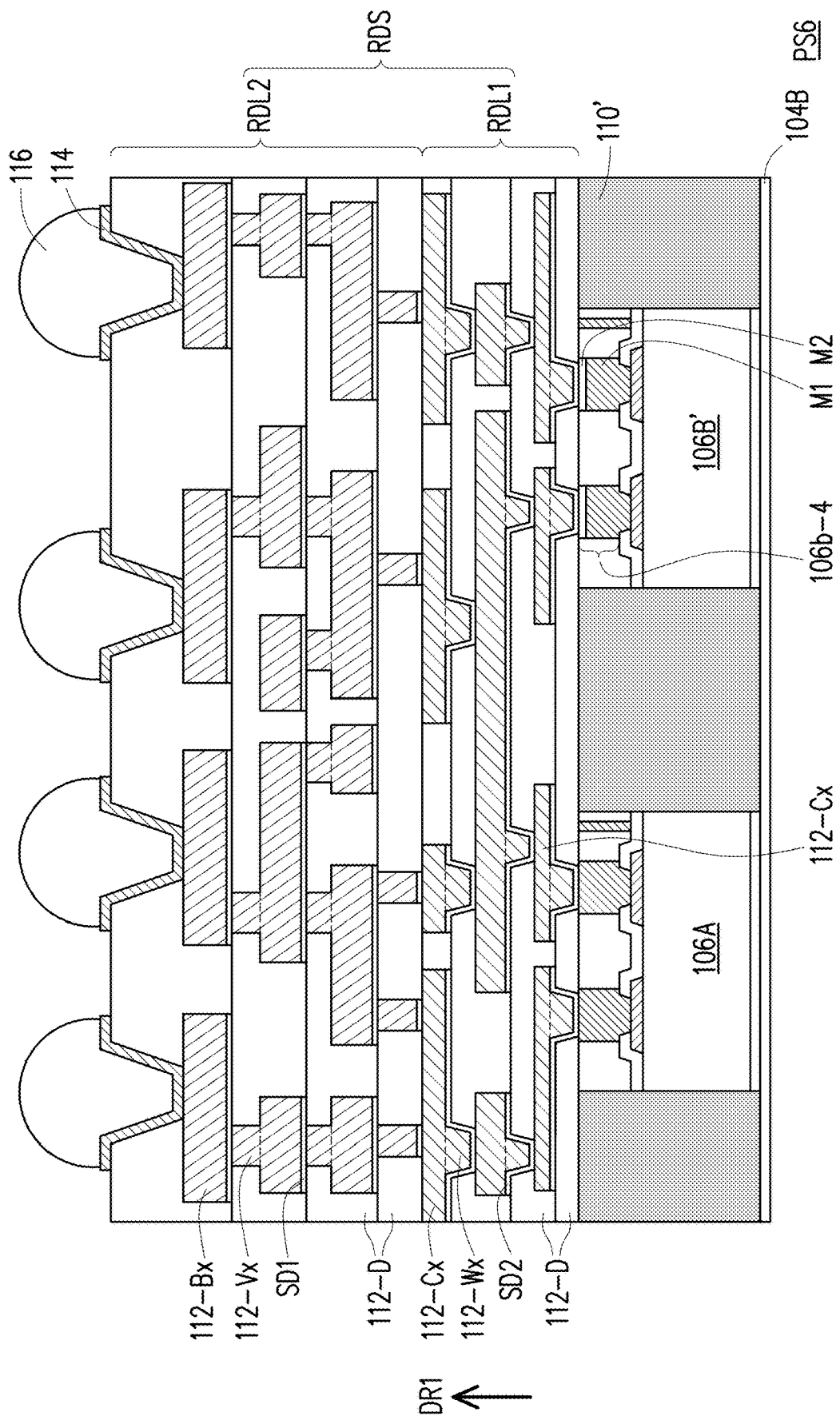
FIG. 8 is a schematic sectional view of a package structure according to some other exemplary embodiments of the present disclosure.

FIG. 8 is a schematic sectional view of a package structure according to some other exemplary embodiments of the present disclosure. The package structure PS6 illustrated in FIG. 8 is similar to the package structure PS5 illustrated in FIG. 7, hence, the same reference numerals are used to refer to the same or liked parts, and its detailed description will be omitted herein. The difference between the embodiments is that the through insulator vias 108 are omitted in FIG. 8. Since the through insulator vias 108 are omitted in the package structure PS6, the conductive balls 118 placed on the through insulator vias 108 may also be omitted. Similar to the embodiments above, cleaning processes (single wafer spin cleaning process) are performed to treat the surfaces of the conductive posts (106a-4/106b-4), the alignment mark (106a-AM/106b-AM), and the first via portions 112-Vx. Therefore, the surfaces of the conductive posts (106a-4/106b-4), the alignment mark (106a-AM/106b-AM), and the first via portions 112-Vx may have a smaller roughness, and a collapse issue of vias or connection structures formed thereon may be prevented.

Figure 9:
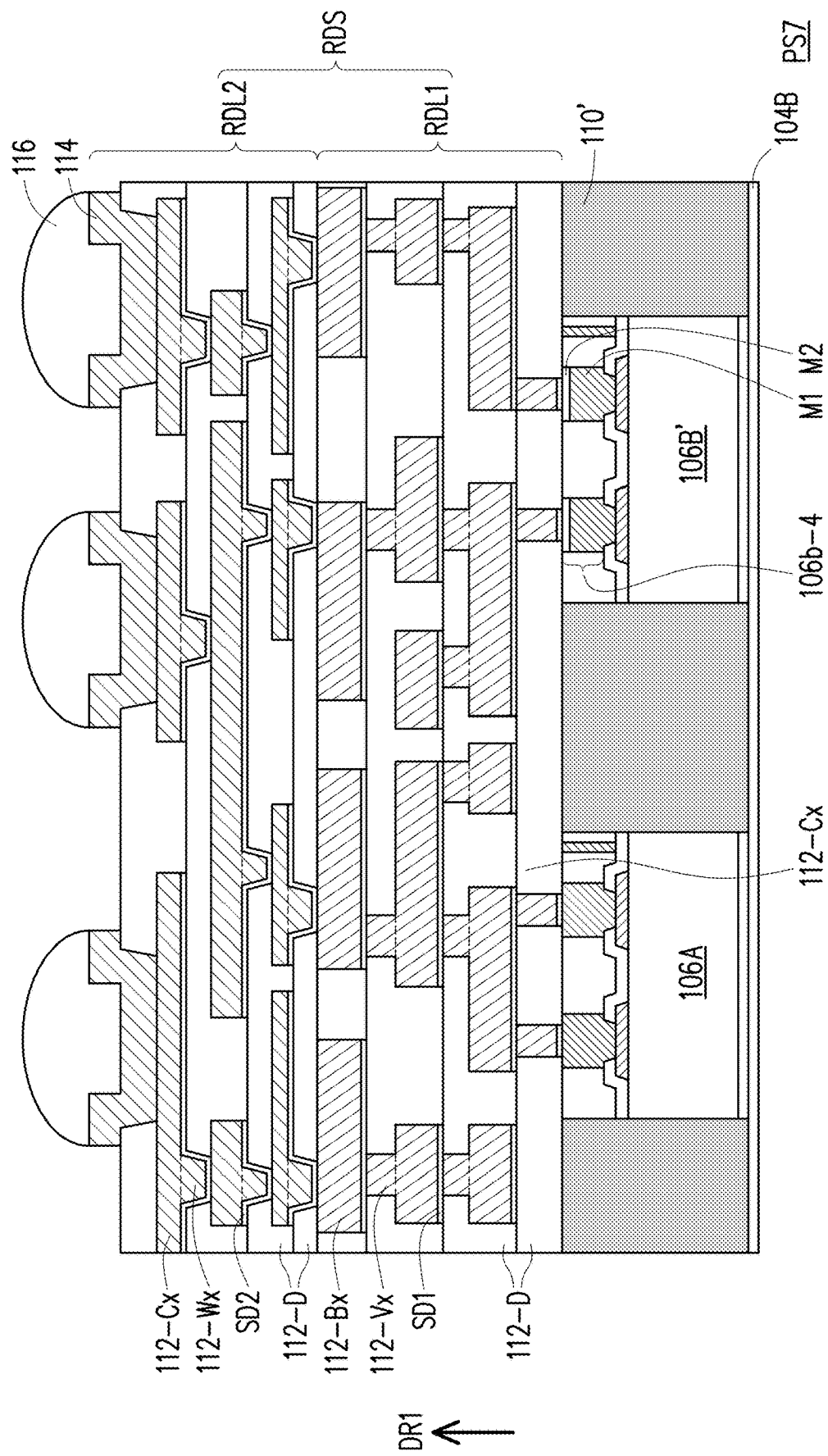
FIG. 9 is a schematic sectional view of a package structure according to some other exemplary embodiments of the present disclosure.

FIG. 9 is a schematic sectional view of a package structure according to some other exemplary embodiments of the present disclosure. The package structure PS7 illustrated in FIG. 9 is similar to the package structure PS6 illustrated in FIG. 8, hence, the same reference numerals are used to refer to the same or liked parts, and its detailed description will be omitted herein. The difference between the embodiments is in the design of the redistribution structure RDS. In the embodiment shown in FIG. 8, the redistribution structure RDS is formed by forming the first redistribution layer RDL1 having the second via portions 112-Wx, then forming the second redistribution layer RDL2 having the first via portions 112-Vx. However, the disclosure is not limited thereto.

For example, as illustrated in FIG. 9, in some embodiments, the first redistribution layer RDL1 is constituted by dielectric layers 112-D, planar seed layers SD1, first via portions 112-Vx and conductive body portions 112-Bx as described in FIG. 1A to FIG. 1K. In certain embodiments, the second redistribution layer RDL2 is constituted by dielectric layers 112-D, non-planar seed layers SD2, second via portions 112-Wx and conductive body portions 112-Cx as described in FIG. 5. In other words, the redistribution structure RDS of FIG. 9 is formed by forming the first redistribution layer RDL1 having the first via portions 112-Vx, then forming the second redistribution layer RDL2 having the second via portions 112-Wx. Similar to the embodiments above, cleaning processes (single wafer spin cleaning process) are performed to treat the surfaces of the conductive posts (106a-4/106b-4), the alignment mark (106a-AM/106b-AM), and the first via portions 112-Vx. Therefore, the surfaces of the conductive posts (106a-4/106b-4), the alignment mark (106a-AM/106b-AM), and the first via portions 112-Vx may have a smaller roughness, and a collapse issue of vias or connection structures formed thereon may be prevented.

In the above-mentioned embodiments, at least one cleaning process (single wafer spin cleaning process) is performed to clean the surfaces of the conductive posts, the alignment mark, the through insulator vias and the conductive via portions (first via portions) using the designated cleaning solutions (first solution/second solution). As such, the surfaces of the conductive posts, the alignment mark, the through insulator vias and the conductive via portions (first via portions) may have a smaller roughness. Due to a smoother surface, a collapse issue of vias or connection structures formed on the conductive posts, the through insulator vias and the conductive via portions (first via portions) may be prevented. Similarly, the alignment mark would have a better alignment profile due to the smoother surface. Overall the reliability window of the package structure may be improved.

In accordance with some embodiments of the present disclosure, a package structure including at least one semiconductor die, an insulating encapsulant and a redistribution structure is provided. The at least one semiconductor die has a plurality of conductive posts, wherein a top surface of the plurality of conductive posts has a first roughness. The insulating encapsulant is encapsulating the at least one semiconductor die. The redistribution structure is disposed on the insulating encapsulant in a build-up direction and is electrically connected to the at least one semiconductor die. The redistribution structure includes a plurality of conductive via portions and a plurality of conductive body portions embedded in dielectric layers, wherein a top surface of the plurality of conductive body portions has a second roughness, and the second roughness is greater than the first roughness.

In accordance with some other embodiments of the present disclosure, a method of fabricating a package structure is described. The method includes the following steps. A plurality of semiconductor dies is provided on a carrier, wherein the plurality of semiconductor dies comprises a plurality of conductive posts. An insulating encapsulant is formed to encapsulate the plurality of semiconductor dies, wherein a top surface of the insulating encapsulant is substantially levelled with a top surface of the plurality of conductive posts. A cleaning process is performed on the plurality of conductive posts, wherein the cleaning process includes a first cleaning step of cleaning the top surface of the plurality of conductive posts with a first solution for 20 seconds to 80 seconds, and wherein the top surface of the plurality of conductive posts has a first roughness after the cleaning process. A redistribution structure is formed on the insulating encapsulant in a build-up direction, wherein the steps of forming the redistribution structure includes forming a plurality of conductive via portions and a plurality of conductive body portions embedded in dielectric layers, and wherein a top surface of the plurality of conductive body portions has a second roughness, and the second roughness is greater than the first roughness. The carrier is then de-bonded.

In yet another embodiment of the present disclosure, a method of fabricating a package structure is described. The method includes the following steps. At least one semiconductor die is provided on a carrier, wherein the at least one semiconductor die includes a plurality of conductive posts. An insulating encapsulant is formed to encapsulate the at least one semiconductor die. A planarization process is performed by removing portions of the insulating encapsulant to reveal a top surface of the plurality of conductive posts. A single wafer spin cleaning process is performed on the plurality of conductive posts after the planarization process, wherein the single wafer spin cleaning process includes dropping a first solution onto the top surface of the plurality of conductive posts while spinning the carrier for 20 seconds to 80 seconds to clean the top surface of the plurality of conductive posts. A redistribution structure is formed on the insulating encapsulant, wherein the redistribution structure is formed by the following steps. A plurality of conductive body portions, a plurality of first via portions and a plurality of dielectric layers are formed to be alternately stacked, wherein the plurality of first via portions is formed with a lateral dimension that is kept constant from a first end to a second end of the first via portions, and a via cleaning process is performed on a surface of the second end after forming each of the plurality of first via portions, the via cleaning process comprises dropping the first solution onto the surface of the second end of the first via portions while spinning the carrier for 20 seconds to 80 seconds to clean the surface of the second end. The carrier is then de-bonded.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing at least one semiconductor die having a plurality of conductive posts;
    performing a cleaning process on the plurality of conductive posts so that a top surface of the plurality of conductive posts has a first roughness; and
    forming a redistribution structure disposed on and electrically connected to the at least one semiconductor die, wherein the redistribution structure comprises a plurality of conductive via portions and a plurality of conductive body portions embedded in dielectric layers, wherein a top surface of the plurality of conductive body portions has a second roughness, and the second roughness is greater than the first roughness.

2. The method according to claim 1, wherein the cleaning process comprises a first cleaning step of cleaning the top surface of the plurality of conductive posts with a first solution.

3. The method according to claim 2, wherein the first solution comprises at least one acid selected from the group consisting of acetic acid, formic acid, citric acid, ascorbic acid, hydrofluoric acid, hydrochloric acid, phosphoric acid and nitric acid.

4. The method according to claim 2, wherein the first solution comprises at least one amine-based solution selected from the group consisting of ethanolamine, hydroxyethyl ethylenediamine, ammonium hydroxide and ammonium chloride.

5. The method according to claim 2, wherein the cleaning process further comprises a second cleaning step of cleaning the top surface of the plurality of conductive posts with a second solution.

6. The method according to claim 1, further comprising performing a via cleaning process for cleaning a surface of the plurality of conductive via portions, wherein the surface of the plurality of conductive via portions has a third roughness after the via cleaning process, and the third roughness is smaller than the second roughness.

7. The method according to claim 1, wherein the first roughness is in a range of 0.1 μm to 1 μm.

8. A method, comprising:
providing a semiconductor die and a plurality of through insulator vias surrounding the semiconductor die;
forming a redistribution layer disposed on and electrically connected to the semiconductor die and the plurality of through insulator vias, wherein forming the redistribution layer comprises:
forming a plurality of first via portions disposed on the semiconductor die and the plurality of through insulator vias, and performing a first via cleaning process on the plurality of first via portions with a first solution;
forming a plurality of conductive body portions on the plurality of first via portions; and
forming a plurality of second via portions disposed on the plurality of conductive body portions, and performing a second via cleaning process on the plurality of second via portions with the first solution.

9. The method according to claim 8, wherein forming the redistribution layer further comprises:
forming a first dielectric layer surrounding the plurality of first via portions, wherein a top surface of the first dielectric layer is coplanar with top surfaces of the plurality of first via portions; and
forming a second dielectric layer disposed on the first dielectric layer and surrounding the plurality of conductive body portions and the plurality of second via portions, wherein a top surface of the second dielectric layer is coplanar with top surfaces of the plurality of second via portions.

10. The method according to claim 8, wherein after cleaning the plurality of first via portions and the plurality of second via portions with the first via cleaning process and the second via cleaning process, a roughness of the top surfaces of the plurality of first via portions and a roughness of the top surfaces of the plurality of second via portions are smaller than a roughness of top surfaces of the plurality of conductive body portions.

11. The method according to claim 8, wherein forming the redistribution layer further comprises:
forming a planar seed layer on the plurality of first via portions after the first via cleaning process; and
forming the plurality of conductive body portions on the planar seed layer.

12. The method according to claim 8, further comprising:
forming a second redistribution layer stacked on the redistribution layer, wherein forming the second redistribution layer comprises:
forming a plurality of non-planar seed layer; and
forming a plurality of second conductive via portions and a plurality of second conductive body portions directly disposed on the non-planar seed layer.

13. The method according to claim 8, wherein the first solution is a citric acid solution.

14. The method according to claim 13, wherein the first via cleaning process further comprising cleaning the plurality of first via portions with a second solution, and the second solution comprises at least one acid selected from the group consisting of acetic acid, formic acid, citric acid, ascorbic acid, hydrofluoric acid, hydrochloric acid, phosphoric acid and nitric acid.

15. A method, comprising:
providing semiconductor dies and through insulator vias over a carrier;
forming an insulating encapsulant encapsulating the semiconductor dies and the through insulator vias;
performing a planarization step on the semiconductor dies, the through insulator vias and the insulating encapsulant so that the semiconductor dies, the through insulator vias and the insulating encapsulant has coplanar top surfaces;
performing a spin cleaning process by dropping a first solution on the coplanar top surfaces while spinning the carrier, wherein the spinning is performed for 20 seconds to 80 seconds.

16. The method according to claim 15, further comprising:
forming a plurality of conductive via portions electrically connected to the semiconductor dies and the through insulator vias;
forming a dielectric layer surrounding the plurality of conductive via portions; and
performing a second spin cleaning process by dropping the first solution on top surfaces of the plurality of conductive via portions while spinning the carrier.

17. The method according to claim 16, further comprising:
forming a planar seed layer on the plurality of conductive via portions after the second spin cleaning process; and
forming a plurality of conductive body portions on the planar seed layer.

18. The method according to claim 17, wherein a roughness of the top surfaces of the plurality of conductive via portions after performing the second spin cleaning process is smaller than a roughness of top surfaces of the plurality of conductive body portions.

19. The method according to claim 15, wherein the first solution comprises at least one acid selected from the group consisting of acetic acid, formic acid, citric acid, ascorbic acid, hydrofluoric acid, hydrochloric acid, phosphoric acid and nitric acid, and a concentration of the at least one acid is in a range of 0.05% to 10% by weight.

20. The method according to claim 15, further comprising performing an auxiliary spin cleaning process by dropping a second solution on the coplanar top surfaces while spinning the carrier, wherein the spinning is performed for 20 seconds to 80 seconds, and the second solution is different from the first solution.

* * * * *